US007387868B2

(12) United States Patent
Jacobson et al.

(10) Patent No.: US 7,387,868 B2
(45) Date of Patent: *Jun. 17, 2008

(54) TREATMENT OF A DIELECTRIC LAYER USING SUPERCRITICAL $CO_2$

(75) Inventors: Gunilla Jacobson, Menlo Park, CA (US); Deborah Yellowaga, Phoenix, AZ (US)

(73) Assignee: Tokyo Electron Limited, Minato-ku, Tokyo (JP)

( * ) Notice: Subject to any disclaimer, the term of this patent is extended or adjusted under 35 U.S.C. 154(b) by 345 days.

This patent is subject to a terminal disclaimer.

(21) Appl. No.: 11/092,031

(22) Filed: Mar. 28, 2005

(65) Prior Publication Data
US 2005/0191865 A1 Sep. 1, 2005

Related U.S. Application Data

(63) Continuation-in-part of application No. 10/379,984, filed on Mar. 4, 2003, now Pat. No. 7,270,941.

(60) Provisional application No. 60/369,052, filed on Mar. 29, 2002, provisional application No. 60/361,917, filed on Mar. 4, 2002.

(51) Int. Cl.
G03F 7/26 (2006.01)

(52) U.S. Cl. .................. 430/313; 430/329; 134/1.3

(58) Field of Classification Search .............. 430/311, 430/313, 315, 322, 324, 325, 329, 330; 134/1, 134/1.3
See application file for complete search history.

(56) References Cited

U.S. PATENT DOCUMENTS

| | | | |
|---|---|---|---|
| 2,439,689 A | 4/1948 | Hyde et al. | |
| 2,617,719 A | 11/1952 | Stewart | |
| 2,625,886 A | 1/1953 | Browne | |
| 2,873,597 A | 2/1959 | Fahringer | |
| 2,993,449 A | 7/1961 | Harland | 103/87 |
| 3,135,211 A | 6/1964 | Pezzillo | 103/87 |
| 3,521,765 A | 7/1970 | Kauffman et al. | |
| 3,623,627 A | 11/1971 | Bolton | |
| 3,642,020 A | 2/1972 | Payne | |
| 3,646,948 A | 3/1972 | Athey | 134/57 D |
| 3,681,171 A | 8/1972 | Toku Hojo et al. | |
| 3,744,660 A | 7/1973 | Gaines et al. | |
| 3,890,176 A | 6/1975 | Bolon | |
| 3,900,551 A | 8/1975 | Bardoncelli et al. | |
| 3,968,885 A | 7/1976 | Hassan et al. | |
| 4,029,517 A | 6/1977 | Rand | |
| 4,091,643 A | 5/1978 | Zucchini | |
| 4,145,161 A | 3/1979 | Skinner | |
| 4,219,333 A | 8/1980 | Harris | |
| 4,245,154 A | 1/1981 | Uehara et al. | |
| 4,316,750 A | 2/1982 | Gengler | 134/18 |
| 4,341,592 A | 7/1982 | Shortes et al. | |
| 4,349,415 A | 9/1982 | DeFilippi et al. | |
| 4,355,937 A | 10/1982 | Mack et al. | |
| 4,367,140 A | 1/1983 | Wilson | |
| 4,391,511 A | 7/1983 | Akiyama et al. | |
| 4,406,596 A | 9/1983 | Budde | |
| 4,422,651 A | 12/1983 | Platts | |
| 4,426,358 A | 1/1984 | Johansson | |
| 4,474,199 A | 10/1984 | Blaudszun | |
| 4,475,993 A | 10/1984 | Blander et al. | |
| 4,522,788 A | 6/1985 | Sitek et al. | |
| 4,549,467 A | 10/1985 | Wilden et al. | |
| 4,574,184 A | 3/1986 | Wolf et al. | |
| 4,592,306 A | 6/1986 | Gallego | |
| 4,601,181 A | 7/1986 | Privat | |
| 4,618,769 A | 10/1986 | Johnson et al. | 250/338 |
| 4,626,509 A | 12/1986 | Lyman | |
| 4,670,126 A | 6/1987 | Messer et al. | |
| 4,682,937 A | 7/1987 | Credle, Jr. | |
| 4,693,777 A | 9/1987 | Hazano et al. | |
| 4,730,630 A | 3/1988 | Ranft | 134/111 |
| 4,749,440 A | 6/1988 | Blackwood et al. | |
| 4,778,356 A | 10/1988 | Hicks | |
| 4,788,043 A | 11/1988 | Kagiyama et al. | |

(Continued)

FOREIGN PATENT DOCUMENTS

EP     0 244 951 A2     11/1987

(Continued)

OTHER PUBLICATIONS

J.B. Rubin et al. "A Comparison of Chilled DI Water/Ozone and Co2-Based Supercritical Fluids as Replacements for Photoresist-Stripping Solvents", IEEE/CPMT Int'l Electronics Manufacturing Technology Symposium, 1998, pp. 308-314.
"Los Almos National Laboratory," Solid State Technology, pp. S10 & S14, Oct. 1998.
"Supercritical Carbon Dioxide Resist Remover, SCORR, the Path to Least Photoresistance," Los Alamos National Laboratory, 1998.

(Continued)

*Primary Examiner*—Kathleen Duda
(74) *Attorney, Agent, or Firm*—Haverstock & Owens LLP

(57) ABSTRACT

A method of passivating silicon-oxide based low-k materials using a supercritical carbon dioxide passivating solution comprising a silylating agent is disclosed. The silylating agent is preferably an organosilicon compound comprising organo-groups with five carbon atoms such as hexamethyldisilazane (HMDS), chlorotrimethylsilane (TMCS), trichloromethylsilane (TCMS) and combinations thereof. In accordance with further embodiments of the invention, a post ash substrate comprising a dielectric material is simultaneously cleaned and passivated using a supercritical carbon dioxide cleaning solution.

36 Claims, 6 Drawing Sheets

U.S. PATENT DOCUMENTS

| | | |
|---|---|---|
| 4,789,077 A | 12/1988 | Noe |
| 4,823,976 A | 4/1989 | White, III et al. |
| 4,825,808 A | 5/1989 | Takahashi et al. |
| 4,827,867 A | 5/1989 | Takei et al. |
| 4,838,476 A | 6/1989 | Rahn |
| 4,865,061 A | 9/1989 | Fowler et al. |
| 4,877,530 A | 10/1989 | Moses |
| 4,879,004 A | 11/1989 | Oesch et al. |
| 4,879,431 A | 11/1989 | Bertoncini |
| 4,917,556 A | 4/1990 | Stark et al. |
| 4,923,828 A | 5/1990 | Gluck et al. |
| 4,924,892 A | 5/1990 | Kiba et al. |
| 4,925,790 A | 5/1990 | Blanch et al. |
| 4,933,404 A | 6/1990 | Beckman et al. |
| 4,944,837 A | 7/1990 | Nishikawa et al. |
| 4,951,601 A | 8/1990 | Maydan et al. |
| 4,960,140 A | 10/1990 | Ishijima et al. |
| 4,983,223 A | 1/1991 | Gessner |
| 5,009,738 A | 4/1991 | Gruenwald et al. |
| 5,011,542 A | 4/1991 | Weil |
| 5,013,366 A | 5/1991 | Jackson et al. |
| 5,044,871 A | 9/1991 | Davis et al. |
| 5,062,770 A | 11/1991 | Story et al. |
| 5,068,040 A | 11/1991 | Jackson |
| 5,071,485 A | 12/1991 | Matthews et al. |
| 5,091,207 A | 2/1992 | Tanaka |
| 5,105,556 A | 4/1992 | Kurokawa et al. |
| 5,143,103 A | 9/1992 | Basso et al. |
| 5,158,704 A | 10/1992 | Fulton et al. |
| 5,167,716 A | 12/1992 | Boitnott et al. |
| 5,169,296 A | 12/1992 | Wilden |
| 5,169,408 A | 12/1992 | Biggerstaff et al. |
| 5,174,917 A | 12/1992 | Monzyk |
| 5,185,058 A | 2/1993 | Cathey, Jr. |
| 5,185,296 A | 2/1993 | Morita et al. |
| 5,186,594 A | 2/1993 | Toshima |
| 5,186,718 A | 2/1993 | Tepman et al. |
| 5,188,515 A | 2/1993 | Horn |
| 5,190,373 A | 3/1993 | Dickson et al. |
| 5,191,993 A | 3/1993 | Wanger et al. |
| 5,193,560 A | 3/1993 | Tanaka et al. |
| 5,195,878 A | 3/1993 | Sahiavo et al. |
| 5,196,134 A | 3/1993 | Jackson |
| 5,197,800 A | 3/1993 | Saidman et al. ............. 366/136 |
| 5,201,960 A | 4/1993 | Starov |
| 5,213,485 A | 5/1993 | Wilden |
| 5,213,619 A | 5/1993 | Jackson et al. |
| 5,215,592 A | 6/1993 | Jackson |
| 5,217,043 A | 6/1993 | Novakovi |
| 5,221,019 A | 6/1993 | Pechacek |
| 5,222,876 A | 6/1993 | Budde |
| 5,224,504 A | 7/1993 | Thompson et al. |
| 5,225,173 A | 7/1993 | Wai |
| 5,236,602 A | 8/1993 | Jackson |
| 5,236,669 A | 8/1993 | Simmons et al. |
| 5,237,824 A | 8/1993 | Pawliszyn |
| 5,238,671 A | 8/1993 | Matson et al. |
| 5,240,390 A | 8/1993 | Kvinge et al. |
| 5,242,641 A | 9/1993 | Horner et al. ................ 264/104 |
| 5,243,821 A | 9/1993 | Schuck et al. |
| 5,246,500 A | 9/1993 | Samata et al. |
| 5,250,078 A | 10/1993 | Saus et al. |
| 5,251,776 A | 10/1993 | Morgan, Jr. et al. |
| 5,252,041 A | 10/1993 | Schumack |
| 5,259,731 A | 11/1993 | Dhindsa et al. |
| 5,261,965 A | 11/1993 | Moslehi |
| 5,266,205 A | 11/1993 | Fulton et al. |
| 5,267,455 A | 12/1993 | Dewees et al. |
| 5,269,815 A | 12/1993 | Schlenker et al. |
| 5,269,850 A | 12/1993 | Jackson |
| 5,274,129 A | 12/1993 | Natale et al. |
| 5,280,693 A | 1/1994 | Heudecker |
| 5,285,352 A | 2/1994 | Pastore et al. |
| 5,288,333 A | 2/1994 | Tanaka et al. |
| 5,290,361 A | 3/1994 | Hayashida et al. |
| 5,294,261 A | 3/1994 | McDermott et al. |
| 5,298,032 A | 3/1994 | Schlenker et al. |
| 5,304,515 A | 4/1994 | Morita et al. |
| 5,306,350 A | 4/1994 | Hoy et al. |
| 5,312,882 A | 5/1994 | DeSimone et al. |
| 5,313,965 A | 5/1994 | Palen |
| 5,314,574 A | 5/1994 | Takahashi |
| 5,316,591 A | 5/1994 | Chao et al. |
| 5,320,742 A | 6/1994 | Fletcher et al. |
| 5,328,722 A | 7/1994 | Ghanayem et al. |
| 5,331,986 A | 7/1994 | Lim et al. ...................... 134/88 |
| 5,334,332 A | 8/1994 | Lee |
| 5,334,493 A | 8/1994 | Fujita et al. |
| 5,337,446 A | 8/1994 | Smith et al. |
| 5,339,539 A | 8/1994 | Shiraishi et al. ................. 34/58 |
| 5,339,844 A | 8/1994 | Stanford, Jr. et al. |
| 5,352,327 A | 10/1994 | Witowski |
| 5,355,901 A | 10/1994 | Mielnik et al. |
| 5,356,538 A | 10/1994 | Wai et al. |
| 5,364,497 A | 11/1994 | Chau et al. |
| 5,368,171 A | 11/1994 | Jackson |
| 5,370,740 A | 12/1994 | Chao et al. |
| 5,370,741 A | 12/1994 | Bergman |
| 5,370,742 A | 12/1994 | Mitchell et al. |
| 5,374,829 A | 12/1994 | Sakamoto et al. |
| 5,377,705 A | 1/1995 | Smith, Jr. et al. |
| 5,378,311 A | 1/1995 | Nagayama et al. .......... 156/643 |
| 5,397,220 A | 3/1995 | Akihisa et al. .............. 417/369 |
| 5,401,322 A | 3/1995 | Marshall |
| 5,403,621 A | 4/1995 | Jackson et al. |
| 5,403,665 A | 4/1995 | Alley et al. |
| 5,404,894 A | 4/1995 | Shiraiwa |
| 5,412,958 A | 5/1995 | Iliff et al. |
| 5,417,768 A | 5/1995 | Smith, Jr. et al. |
| 5,433,334 A | 7/1995 | Reneau |
| 5,434,107 A | 7/1995 | Paranjpe ..................... 437/225 |
| 5,447,294 A | 9/1995 | Sakata et al. |
| 5,456,759 A | 10/1995 | Stanford, Jr. et al. |
| 5,470,393 A | 11/1995 | Fukazawa |
| 5,474,410 A | 12/1995 | Ozawa et al. |
| 5,474,812 A | 12/1995 | Truckenmuller et al. |
| 5,482,564 A | 1/1996 | Douglas et al. |
| 5,486,212 A | 1/1996 | Mitchell et al. |
| 5,494,526 A | 2/1996 | Paranjpe |
| 5,500,081 A | 3/1996 | Bergman |
| 5,501,761 A | 3/1996 | Evans et al. |
| 5,503,176 A | 4/1996 | Dunmire et al. |
| 5,505,219 A | 4/1996 | Lansberry et al. |
| 5,509,431 A | 4/1996 | Smith, Jr. et al. |
| 5,514,220 A | 5/1996 | Wetmore et al. |
| 5,522,938 A | 6/1996 | O'Brien |
| 5,526,834 A | 6/1996 | Mielnik et al. |
| 5,533,538 A | 7/1996 | Marshall |
| 5,540,554 A | 7/1996 | Masuzawa |
| 5,547,774 A | 8/1996 | Gimzewski et al. |
| 5,550,211 A | 8/1996 | DeCrosta et al. |
| 5,571,330 A | 11/1996 | Kyogoku |
| 5,580,846 A | 12/1996 | Hayashida et al. |
| 5,589,082 A | 12/1996 | Lin et al. |
| 5,589,105 A | 12/1996 | DeSimone et al. |
| 5,589,224 A | 12/1996 | Tepman et al. |
| 5,621,982 A | 4/1997 | Yamashita et al. |
| 5,629,918 A | 5/1997 | Ho et al. |
| 5,632,847 A | 5/1997 | Ohno et al. |
| 5,635,463 A | 6/1997 | Muraoka |
| 5,637,151 A | 6/1997 | Schulz |
| 5,641,887 A | 6/1997 | Beckman et al. |
| 5,644,855 A | 7/1997 | McDermott et al. |
| 5,649,809 A | 7/1997 | Stapelfeldt |

| | | | | | | |
|---|---|---|---|---|---|---|
| 5,656,097 A | 8/1997 | Olesen et al. | | 5,994,696 A | 11/1999 | Tai et al. |
| 5,665,527 A | 9/1997 | Allen et al. | | 6,005,226 A | 12/1999 | Aschner et al. |
| 5,669,251 A | 9/1997 | Townsend et al. | | 6,017,820 A | 1/2000 | Ting et al. |
| 5,672,204 A | 9/1997 | Habuka | | 6,021,791 A | 2/2000 | Dryer et al. |
| 5,676,705 A | 10/1997 | Jureller et al. | | 6,024,801 A | 2/2000 | Wallace et al. |
| 5,679,169 A | 10/1997 | Gonzales et al. | | 6,029,371 A | 2/2000 | Kamikawa et al. |
| 5,679,171 A | 10/1997 | Saga et al. | | 6,035,871 A | 3/2000 | Eui-Yeol |
| 5,683,473 A | 11/1997 | Jureller et al. | | 6,037,277 A | 3/2000 | Masakara et al. |
| 5,683,977 A | 11/1997 | Jureller et al. | | 6,041,817 A | 3/2000 | Guertin |
| 5,688,617 A | 11/1997 | Mikami et al. ................. 430/5 | | 6,045,331 A | 4/2000 | Gehm et al. |
| 5,688,879 A | 11/1997 | DeSimone | | 6,048,494 A | 4/2000 | Annapragada |
| 5,700,379 A | 12/1997 | Biebl | | 6,053,348 A | 4/2000 | Morch |
| 5,702,228 A | 12/1997 | Tamai et al. | | 6,056,008 A | 5/2000 | Adams et al. |
| 5,706,319 A | 1/1998 | Holtz | | 6,062,853 A | 5/2000 | Shimazu et al. |
| 5,714,299 A | 2/1998 | Combes et al. | | 6,063,714 A | 5/2000 | Smith et al. |
| 5,725,987 A | 3/1998 | Combes et al. | | 6,067,728 A | 5/2000 | Farmer et al. |
| 5,726,211 A | 3/1998 | Hedrick et al. | | 6,070,440 A | 6/2000 | Malchow et al. |
| 5,730,874 A | 3/1998 | Wai et al. | | 6,077,053 A | 6/2000 | Fujikawa et al. |
| 5,736,425 A | 4/1998 | Smith et al. | | 6,077,321 A | 6/2000 | Adachi et al. |
| 5,739,223 A | 4/1998 | DeSimone | | 6,082,150 A | 7/2000 | Stucker |
| 5,746,008 A | 5/1998 | Yamashita et al. | | 6,085,762 A | 7/2000 | Barton ....................... 134/25.4 |
| 5,766,367 A | 6/1998 | Smith et al. | | 6,085,935 A | 7/2000 | Malchow et al. |
| 5,769,588 A | 6/1998 | Toshima | | 6,089,377 A | 7/2000 | Shimizu |
| 5,772,783 A | 6/1998 | Stucker | | 6,097,015 A | 8/2000 | McCullough et al. |
| 5,783,082 A | 7/1998 | DeSimone et al. | | 6,099,619 A | 8/2000 | Lansbarkis et al. |
| 5,797,719 A | 8/1998 | James et al. | | 6,100,198 A | 8/2000 | Grieger et al. |
| 5,798,126 A | 8/1998 | Fujikawa et al. | | 6,103,638 A | 8/2000 | Robinson ..................... 438/778 |
| 5,798,438 A | 8/1998 | Sawan et al. | | 6,110,232 A | 8/2000 | Chen et al. |
| 5,804,607 A | 9/1998 | Hedrick et al. | | 6,114,044 A | 9/2000 | Houston et al. |
| 5,807,607 A | 9/1998 | Smith et al. | | 6,122,566 A | 9/2000 | Nguyen et al. |
| 5,817,178 A | 10/1998 | Mita et al. | | 6,123,510 A | 9/2000 | Greer et al. |
| 5,847,443 A | 12/1998 | Cho et al. | | 6,128,830 A | 10/2000 | Bettcher et al. |
| 5,850,747 A | 12/1998 | Roberts et al. | | 6,140,252 A | 10/2000 | Cho et al. |
| 5,858,107 A | 1/1999 | Chao et al. | | 6,145,519 A | 11/2000 | Konishi et al. |
| 5,865,602 A | 2/1999 | Nozari | | 6,149,828 A | 11/2000 | Vaarststra |
| 5,866,005 A | 2/1999 | DeSimone et al. | | 6,159,295 A | 12/2000 | Maskara et al. |
| 5,868,856 A | 2/1999 | Douglas et al. | | 6,164,297 A | 12/2000 | Kamikawa |
| 5,868,862 A | 2/1999 | Douglas et al. | | 6,171,645 B1 | 1/2001 | Smith et al. |
| 5,872,061 A | 2/1999 | Lee et al. | | 6,186,722 B1 | 2/2001 | Shirai |
| 5,872,257 A | 2/1999 | Beckman et al. | | 6,190,459 B1 | 2/2001 | Takeshita et al. ............ 118/715 |
| 5,873,948 A | 2/1999 | Kim | | 6,200,943 B1 | 3/2001 | Romack et al. |
| 5,879,459 A | 3/1999 | Gadgil et al. | | 6,203,582 B1 | 3/2001 | Berner et al. |
| 5,881,577 A | 3/1999 | Sauer et al. | | 6,216,364 B1 | 4/2001 | Tanaka et al. |
| 5,882,165 A | 3/1999 | Maydan et al. | | 6,221,781 B1 | 4/2001 | Siefering et al. |
| 5,888,050 A | 3/1999 | Fitzgerald et al. | | 6,224,774 B1 | 5/2001 | DeSimone et al. |
| 5,890,501 A | 4/1999 | Kaneko et al. ................ 134/1.3 | | 6,228,563 B1 | 5/2001 | Starov et al. |
| 5,893,756 A | 4/1999 | Berman et al. | | 6,228,826 B1 | 5/2001 | DeYoung et al. |
| 5,896,870 A | 4/1999 | Huynh et al. | | 6,232,238 B1 | 5/2001 | Chang et al. |
| 5,898,727 A | 4/1999 | Fujikawa et al. | | 6,232,417 B1 | 5/2001 | Rhodes et al. |
| 5,900,107 A | 5/1999 | Murphy et al. | | 6,235,145 B1 | 5/2001 | Li et al. ...................... 156/345 |
| 5,900,354 A | 5/1999 | Batchelder | | 6,235,634 B1 | 5/2001 | White et al. |
| 5,904,737 A | 5/1999 | Preston et al. | | 6,239,038 B1 | 5/2001 | Wen |
| 5,906,866 A | 5/1999 | Webb | | 6,241,825 B1 | 6/2001 | Wytman |
| 5,908,510 A | 6/1999 | McCullough et al. | | 6,242,165 B1 | 6/2001 | Vaartstra |
| 5,928,389 A | 7/1999 | Jevtic | | 6,244,121 B1 | 6/2001 | Hunter |
| 5,932,100 A | 8/1999 | Yager et al. | | 6,251,250 B1 | 6/2001 | Keigler |
| 5,934,856 A | 8/1999 | Asakawa et al. | | 6,255,732 B1 | 7/2001 | Yokoyama et al. |
| 5,934,991 A | 8/1999 | Rush | | 6,262,510 B1 | 7/2001 | Lungu ........................ 310/254 |
| 5,943,721 A | 8/1999 | Lerette et al. | | 6,264,752 B1 | 7/2001 | Curtis et al. |
| 5,944,996 A | 8/1999 | DeSimone et al. | | 6,264,753 B1 | 7/2001 | Chao et al. |
| 5,946,945 A | 9/1999 | Kegler et al. | | 6,270,531 B1 | 8/2001 | DeYoung et al. |
| 5,954,101 A | 9/1999 | Drube et al. | | 6,270,948 B1 | 8/2001 | Sato et al. |
| 5,955,140 A | 9/1999 | Smith et al. | | 6,277,753 B1 | 8/2001 | Mullee et al. |
| 5,965,025 A | 10/1999 | Wai et al. | | 6,284,558 B1 | 9/2001 | Sakamoto |
| 5,970,554 A | 10/1999 | Shore et al. | | 6,286,231 B1 | 9/2001 | Bergman et al. |
| 5,971,714 A | 10/1999 | Schaffer et al. | | 6,305,677 B1 | 10/2001 | Lenz |
| 5,975,492 A | 11/1999 | Brenes | | 6,306,564 B1 | 10/2001 | Mullee |
| 5,976,264 A | 11/1999 | McCullough et al. | | 6,319,858 B1 | 11/2001 | Lee et al. |
| 5,979,306 A | 11/1999 | Fujikawa et al. | | 6,331,487 B2 | 12/2001 | Koch |
| 5,980,648 A | 11/1999 | Adler | | 6,333,268 B1 | 12/2001 | Starov et al. |
| 5,981,399 A | 11/1999 | Kawamura et al. | | 6,334,266 B1 | 1/2002 | Moritz et al. |
| 5,989,342 A | 11/1999 | Ikeda et al. | | 6,344,174 B1 | 2/2002 | Miller et al. |
| 5,992,680 A | 11/1999 | Smith | | 6,344,243 B1 | 2/2002 | McClain et al. |

| | | |
|---|---|---|
| 6,355,072 B1 | 3/2002 | Racette et al. |
| 6,358,673 B1 | 3/2002 | Namatsu |
| 6,361,696 B1 | 3/2002 | Spiegelman et al. |
| 6,363,292 B1 | 3/2002 | McLoughlin |
| 6,367,491 B1 | 4/2002 | Marshall et al. |
| 6,380,105 B1 | 4/2002 | Smith et al. |
| 6,388,317 B1 | 5/2002 | Reese |
| 6,389,677 B1 | 5/2002 | Lenz |
| 6,406,782 B2 | 6/2002 | Johnson et al. |
| 6,418,956 B1 | 7/2002 | Bloom |
| 6,425,956 B1 | 7/2002 | Cotte et al. |
| 6,436,824 B1 | 8/2002 | Chooi et al. |
| 6,454,519 B1 | 9/2002 | Toshima et al. |
| 6,454,945 B1 | 9/2002 | Weigl et al. |
| 6,458,494 B2 | 10/2002 | Song et al. |
| 6,461,967 B2 | 10/2002 | Wu et al. |
| 6,464,790 B1 | 10/2002 | Sherstinsky et al. |
| 6,465,403 B1 | 10/2002 | Skee |
| 6,485,895 B1 | 11/2002 | Choi et al. |
| 6,486,078 B1 | 11/2002 | Rangarajan et al. |
| 6,492,090 B2 | 12/2002 | Nishi et al. |
| 6,497,239 B2 | 12/2002 | Farmer et al. |
| 6,500,605 B1 | 12/2002 | Mullee et al. |
| 6,508,259 B1 | 1/2003 | Tseronis et al. ............ 134/105 |
| 6,509,141 B2 | 1/2003 | Mullee |
| 6,521,466 B1 | 2/2003 | Castrucci |
| 6,532,772 B1 | 3/2003 | Robinson .................... 65/182.2 |
| 6,537,916 B2 | 3/2003 | Mullee et al. |
| 6,541,278 B2 | 4/2003 | Morita et al. |
| 6,546,946 B2 | 4/2003 | Dunmire |
| 6,550,484 B1 | 4/2003 | Gopinath et al. |
| 6,558,475 B1 | 5/2003 | Jur et al. |
| 6,561,213 B2 | 5/2003 | Wang et al. |
| 6,561,220 B2 | 5/2003 | McCullough et al. |
| 6,561,481 B1 | 5/2003 | Filonczuk |
| 6,561,767 B2 | 5/2003 | Berger et al. |
| 6,562,146 B1 | 5/2003 | DeYoung et al. |
| 6,564,826 B2 | 5/2003 | Shen |
| 6,596,093 B2 | 7/2003 | DeYoung et al. |
| 6,612,317 B2 | 9/2003 | Costantini et al. |
| 6,613,105 B1 | 9/2003 | Moore ....................... 29/25.01 |
| 6,616,414 B2 | 9/2003 | Yoo et al. |
| 6,635,565 B2 | 10/2003 | Wu et al. |
| 6,641,678 B2 | 11/2003 | DeYoung et al. |
| 6,642,140 B1 | 11/2003 | Moore ........................ 438/631 |
| 6,669,785 B2 | 12/2003 | DeYoung et al. ............... 134/3 |
| 6,712,081 B1 | 3/2004 | Uehara et al. ................ 134/105 |
| 6,722,642 B1 | 4/2004 | Sutton et al. |
| 6,736,149 B2 | 5/2004 | Biberger et al. |
| 6,764,212 B1 | 7/2004 | Nitta et al. .................. 366/114 |
| 6,764,552 B1 | 7/2004 | Joyce et al. |
| 6,805,801 B1 | 10/2004 | Humayun et al. |
| 6,815,922 B2 | 11/2004 | Yoo et al. |
| 6,848,458 B1 | 2/2005 | Shrinivasan et al. ......... 134/108 |
| 6,851,148 B2 | 2/2005 | Preston et al. |
| 6,874,513 B2 | 4/2005 | Yamagata et al. |
| 6,890,853 B2 | 5/2005 | Biberger et al. |
| 6,905,555 B2 | 6/2005 | DeYoung et al. ............... 134/30 |
| 6,921,456 B2 | 7/2005 | Biberger et al. |
| 6,966,967 B2 | 11/2005 | Curry et al. |
| 7,044,143 B2 | 5/2006 | DeYoung et al. ............ 134/105 |
| 2001/0019857 A1 | 9/2001 | Yokoyama et al. |
| 2001/0024247 A1 | 9/2001 | Nakata |
| 2001/0041455 A1 | 11/2001 | Yun et al. |
| 2001/0041458 A1 | 11/2001 | Ikakura et al. |
| 2001/0050096 A1 | 12/2001 | Costantini et al. |
| 2002/0001929 A1 | 1/2002 | Biberger et al. |
| 2002/0014257 A1 | 2/2002 | Chandra et al. ................ 134/19 |
| 2002/0046707 A1 | 4/2002 | Biberger et al. |
| 2002/0055323 A1 | 5/2002 | McClain et al. |
| 2002/0074289 A1 | 6/2002 | Sateria et al. |
| 2002/0081533 A1 | 6/2002 | Simons et al. |
| 2002/0088477 A1 | 7/2002 | Cotte et al. |
| 2002/0098680 A1 | 7/2002 | Goldstein et al. |
| 2002/0106867 A1 | 8/2002 | Yang et al. |
| 2002/0112740 A1 | 8/2002 | DeYoung et al. |
| 2002/0112746 A1 | 8/2002 | DeYoung et al. |
| 2002/0115022 A1 | 8/2002 | Messick et al. |
| 2002/0117391 A1 | 8/2002 | Beam |
| 2002/0123229 A1 | 9/2002 | Ono et al. |
| 2002/0127844 A1 | 9/2002 | Grill et al. |
| 2002/0132192 A1 | 9/2002 | Namatsu |
| 2002/0141925 A1 | 10/2002 | Wong et al. |
| 2002/0142595 A1 | 10/2002 | Chiou |
| 2002/0150522 A1 | 10/2002 | Heim et al. |
| 2002/0164873 A1 | 11/2002 | Masuda et al. |
| 2002/0189543 A1 | 12/2002 | Biberger et al. |
| 2003/0003762 A1 | 1/2003 | Cotte et al. |
| 2003/0005948 A1 | 1/2003 | Matsuno et al. |
| 2003/0008155 A1 | 1/2003 | Hayashi et al. ............. 428/447 |
| 2003/0008238 A1 | 1/2003 | Goldfarb et al. |
| 2003/0008518 A1 | 1/2003 | Chang et al. |
| 2003/0013311 A1 | 1/2003 | Chang et al. |
| 2003/0036023 A1* | 2/2003 | Moreau et al. ............... 430/324 |
| 2003/0047533 A1 | 3/2003 | Reid et al. |
| 2003/0051741 A1 | 3/2003 | DeSimone et al. |
| 2003/0081206 A1 | 5/2003 | Doyle ........................ 356/301 |
| 2003/0106573 A1 | 6/2003 | Masuda et al. |
| 2003/0125225 A1 | 7/2003 | Xu et al. |
| 2003/0161734 A1 | 8/2003 | Kim |
| 2003/0198895 A1 | 10/2003 | Toma et al. |
| 2003/0205510 A1 | 11/2003 | Jackson |
| 2003/0217764 A1 | 11/2003 | Masuda et al. |
| 2004/0011386 A1 | 1/2004 | Seghal |
| 2004/0018452 A1 | 1/2004 | Schilling .................... 430/314 |
| 2004/0020518 A1 | 2/2004 | DeYoung et al. |
| 2004/0045588 A1 | 3/2004 | DeYoung et al. .............. 134/26 |
| 2004/0048194 A1 | 3/2004 | Breyta et al. ............. 430/271.1 |
| 2004/0050406 A1 | 3/2004 | Sehgal ......................... 134/26 |
| 2004/0087457 A1 | 5/2004 | Korzenski et al. |
| 2004/0103922 A1 | 6/2004 | Inoue et al. |
| 2004/0112409 A1 | 6/2004 | Schilling |
| 2004/0134515 A1* | 7/2004 | Castrucci ....................... 134/2 |
| 2004/0157463 A1 | 8/2004 | Jones |
| 2004/0168709 A1 | 9/2004 | Drumm et al. ................ 134/18 |
| 2004/0175958 A1 | 9/2004 | Lin et al. .................... 438/778 |
| 2004/0177867 A1 | 9/2004 | Schilling |
| 2004/0211440 A1 | 10/2004 | Wang et al. ..................... 134/2 |
| 2004/0213676 A1 | 10/2004 | Phillips et al. |
| 2004/0255978 A1 | 12/2004 | Fury et al. .................... 134/18 |
| 2004/0259357 A1 | 12/2004 | Saga |
| 2005/0014370 A1 | 1/2005 | Jones |
| 2005/0026547 A1 | 2/2005 | Moore et al. |
| 2005/0111987 A1 | 5/2005 | Yoo et al. |
| 2005/0141998 A1 | 6/2005 | Yoo et al. |
| 2005/0158178 A1 | 7/2005 | Yoo et al. |
| 2005/0191184 A1 | 9/2005 | Vinson, Jr. |
| 2005/0191865 A1 | 9/2005 | Jacobsen et al. ............ 438/780 |
| 2006/0003592 A1 | 1/2006 | Gale et al. .................. 438/745 |
| 2006/0130966 A1 | 6/2006 | Babic et al. |
| 2006/0180175 A1 | 8/2006 | Parent ......................... 134/1.3 |

FOREIGN PATENT DOCUMENTS

| | | |
|---|---|---|
| EP | 0 272 141 A2 | 6/1988 |
| EP | 0 283 740 A2 | 9/1988 |
| EP | 0 391 035 A2 | 10/1990 |
| EP | 0 453 867 A1 | 10/1991 |
| EP | 0 518 653 B1 | 12/1992 |
| EP | 0 536 752 A2 | 4/1993 |
| EP | 0 572 913 A1 | 12/1993 |
| EP | 0 620 270 A3 | 10/1994 |
| EP | 0 641 611 A1 | 8/1995 |
| EP | 0 679 753 B1 | 11/1995 |
| EP | 0 711 864 B1 | 5/1996 |
| EP | 0 726 099 A2 | 8/1996 |

| | | |
|---|---|---|
| EP | 0 727 711 A2 | 8/1996 |
| EP | 0 743 379 A1 | 11/1996 |
| EP | 0 822 583 A2 | 2/1998 |
| EP | 0 903 775 A2 | 3/1999 |
| GB | 2 003 975 A | 3/1979 |
| GB | 2 193 482 A | 2/1988 |
| JP | 60-192333 | 9/1985 |
| JP | 62-111442 | 5/1987 |
| JP | 63-179530 | 7/1988 |
| JP | 1-045131 | 2/1989 |
| JP | 2-122520 | 5/1990 |
| JP | 2-209729 | 8/1990 |
| JP | 2-304941 | 12/1990 |
| JP | 03-080537 | 4/1991 |
| JP | 4-17333 | 1/1992 |
| JP | 5-283511 | 10/1993 |
| JP | 7-24679 | 3/1995 |
| JP | 7-142333 | 6/1995 |
| JP | 8-186140 | 7/1996 |
| JP | 8-222508 A | 8/1996 |
| JP | 8-252549 | 10/1996 |
| JP | 9-43857 | 2/1997 |
| JP | 10-144757 | 5/1998 |
| JP | 10-260537 | 9/1998 |
| JP | 11-204514 | 7/1999 |
| JP | 11-260809 | 9/1999 |
| JP | 11-274132 | 10/1999 |
| JP | 2000-114218 | 4/2000 |
| WO | WO 87/07309 | 12/1987 |
| WO | WO 90/06189 | 6/1990 |
| WO | WO 91/12629 | 8/1991 |
| WO | WO 93/14255 | 7/1993 |
| WO | WO 93/14259 | 7/1993 |
| WO | WO 93/20116 | 10/1993 |
| WO | WO 96/27704 | 9/1996 |
| WO | WO 99/18603 | 4/1999 |
| WO | WO 99/49998 | 10/1999 |
| WO | WO 00/36635 | 6/2000 |
| WO | WO 00/73241 A1 | 12/2000 |
| WO | WO 01/10733 A1 | 2/2001 |
| WO | WO 01/22016 A1 | 3/2001 |
| WO | WO 01/33613 A2 | 5/2001 |
| WO | WO 01/33615 A3 | 5/2001 |
| WO | WO 01/55628 A1 | 8/2001 |
| WO | WO 01/68279 A2 | 9/2001 |
| WO | WO 01/74538 A1 | 10/2001 |
| WO | WO 01/78911 A1 | 10/2001 |
| WO | WO 01/85391 A2 | 11/2001 |
| WO | WO 01/87505 A1 | 11/2001 |
| WO | WO 01/94782 A2 | 12/2001 |
| WO | WO 02/09147 A2 | 1/2002 |
| WO | WO 02/09894 A2 | 2/2002 |
| WO | WO 02/11191 A2 | 2/2002 |
| WO | WO 02/15251 A1 | 2/2002 |
| WO | WO 02/16051 A2 | 2/2002 |
| WO | WO 03/030219 A2 | 10/2003 |

OTHER PUBLICATIONS

Guan, Z. et al., "Fluorocarbon-Based Heterophase Polymeric Materials. 1. Block Copolymer Surfactants for Carbon Dioxide Applications," Macromolecules, vol. 27, 1994, pp. 5527-5532.
International Journal of Environmentally Conscious Design & Manufacturing, vol. 2, No. 1, 1993, p. 83.
Matson and Smith "Supercritical Fluids", Journal of the American Ceramic Society, vol. 72, No. 6, pp. 872-874.
Ziger, D.H. et al., "Compressed Fluid Technology: Application to RIE Developed Resists," AIChE Journal, vol. 33, No. 10, Oct. 1987, pp. 1585-1591.
Kirk-Othmer, "Alcohol Fuels to Toxicology," Encyclopedia of Chemical Terminology, 3rd ed., Supplement Volume, New York: John Wiley & Sons, 1984, pp. 872-893.
"Cleaning with Supercritical $CO_2$," NASA Tech Briefs, MFS-29611, Marshall Space Flight Center, Alabama, Mar. 1979.
Basta, N., "Supercritical Fluids: Still Seeking Acceptance," Chemical Engineering, vol. 92, No. 3, Feb. 24, 1985, p. 1-4.
Takahashi, D., "Los Alamos Lab Finds Way to Cut Chip Toxic Waste," Wall Street Journal, Jun. 22, 1998.
"Supercritical CO2 Process Offers Less Mess from Semiconductor Plants", Chemical Engineering Magazine, pp. 27 & 29, Jul. 1998.
Sun, Y.P. et al., "Preparation of Polymer-Protected Semiconductor Nanoparticles Through the Rapid Expansion of Supercritical Fluid Solution," Chemical Physics Letters, pp. 585-588, May 22, 1998.
Jackson, K. et al., "Surfactants and Microemulsions in Supercritical Fluids," Supercritical Fluid Cleaning, Noyes Publications, Westwood, NJ, pp. 87-120, Spring 1998.
Kryszewski, M., "Production of Metal and Semiconductor Nanoparticles in Polymer Systems," Polimery, pp. 65-73, Feb. 1998.
Bakker, G.L. et al., "Surface Cleaning and Carbonaceous Film Removal Using High Pressure, High Temperature Water, and Water/C02 Mixtures," J. Electrochem. Soc, vol. 145, No. 1, pp. 284-291, Jan. 1998.
Ober, C.K. et al., "Imaging Polymers with Supercritical Carbon Dioxide," Advanced Materials, vol. 9, No. 13, 1039-1043, Nov. 3, 1997.
Russick, E.M. et al., "Supercritical Carbon Dioxide Extraction of Solvent from Micro-machined Structures." Supercritical Fluids Extraction and Pollution Prevention, ACS Symposium Series, vol. 670, pp. 255-269, Oct. 21, 1997.
Dahmen, N. et al., "Supercritical Fluid Extraction of Grinding and Metal Cutting Waste Contaminated with Oils," Supercritical Fluids—Extraction and Pollution Prevention, ACS Symposium Series, vol. 670, pp. 270-279, Oct. 21, 1997.
Wai, C.M., "Supercritical Fluid Extraction: Metals as Complexes," Journal of Chromatography A, vol. 785, pp. 369-383, Oct. 17, 1997.
Xu, C. et al., "Submicron-Sized Spherical Yttrium Oxide Based Phosphors Prepared by Supercritical CO2-Assisted aerosolization and pyrolysis," Appl. Phys. Lett., vol. 71, No. 12, Sep. 22, 1997, pp. 1643-1645.
Tomioka Y, et al., "Decomposition of Tetramethylammonium (TMA) in a Positive Photoresist Developer by Supercritical Water," Abstracts of Papers 214th ACS Natl Meeting, American Chemical Society, Abstract No. 108, Sep. 7, 1997.
Klein, H. et al., "Cyclic Organic Carbonates Serve as Solvents and Reactive Diluents," Coatings World, pp. 38-40, May 1997.
Bühler, J. et al., "Linear Array for Complementary Metal Oxide Semiconductor Double-Pass Metal Micromirrors," Opt. Eng., vol. 36, No. 5, pp. 1391-1398, May 1997.
Jo, M.H. et al., Evaluation of SIO2 Aerogel Thin Film with Ultra Low Dielectric Constant as an Intermetal Dielectric, Microelectronic Engineering, vol. 33, pp. 343-348, Jan. 1997.
McClain, J.B. et al., "Design of Nonionic Surfactants for Supercritical Carbon Dioxide," Science, vol. 274, Dec. 20, 1996. pp. 2049-2052.
Znaidi, L. et al., "Batch and Semi-Continuous Synthesis of Magnesium Oxide Powders from Hydrolysis and Supercritical Treatment of Mg(OCH3)2," Materials Research Bulletin, vol. 31, No. 12, pp. 1527-1335, Dec. 1996.
Tadros, M.E., "Synthesis of Titanium Dioxide Particles in Supercritical CO2," J. Supercritical Fluids, vol. 9, pp. 172-176, Sep. 1996.
Courtecuisse, V.G. et al., "Kinetics of the Titanium Isopropoxide Decomposition in Supercritical Isopropyl Alcohol," Ind. Eng. Chem. Res., vol. 35, No. 8, pp. 2539-2545, Aug. 1996.
Gabor, A.H. et al., "Block and Ranom Copolymer resists Designed for 193 nm Lithography and Environmentally Friendly Supercritical CO2 Development," SPIE, vol. 2724, pp. 410-417, Jun. 1996.
Schimek, G. L. et al., "Supercritical Ammonia Synthesis and Characterization of Four New Alkali Metal Silver Antimony Sulfides . . . ," J. Solid State Chemistry, vol. 123 pp. 277-284, May 1996.
Gallagher-Wetmore, P. et al., "Supercritical Fluid Processing: Opportunities for New Resist Materials and Processes," SPIE, vol. 2725, pp. 289-299, Apr. 1996.

Papathomas, K.I. et al., "Debonding of Photoresists by Organic Solvents," J. Applied Polymer Science, vol. 59, pp. 2029-2037, Mar. 28, 1996.

Watkins, J.J. et al., "Polymer/metal Nanocomposite Synthesis in Supercritical CO2," Chemistry of Materials, vol. 7, No. 11, Nov. 1995., pp. 1991-1994.

Gloyna, E.F. et al., "Supercritical Water Oxidation Research and Development Update," Environmental Progress, vol. 14, No. 3. pp. 182-192, Aug. 1995.

Gallagher-Wetmore, P. et al., "Supercritical Fluid Processing: A New Dry Technique for Photoresist Developing," SPIE vol. 2438, pp. 694-708, Jun. 1995.

Gabor, A. H. et al., "Silicon-Containing Block Copolymer Resist Materials," Microelectronics Technology—Polymers for Advanced Imaging and Packaging , ACS Symposium Series, vol. 614, pp. 281-298, Apr. 1995.

Tsiartas, P.C. et al., "Effect of Molecular Weight Distribution on the Dissolution Properties of Novolac Blends," SPIE, vol. 2438, pp. 264-271, Jun. 1995.

Allen, R.D. et al., "Performance Properties of Near-Monodisperse Novolak Resins,"SPIE, vol. 2438, pp. 250-260, Jun. 1995.

Wood, P.T. et al., "Synthesis of New Channeled Structures in Supercritical Amines . . . ," Inorg. Chem., vol. 33, pp. 1556-1558, 1994.

Jerome, J.E. et al., "Synthesis of New Low-Dimensional Quaternary Compounds . . . ," Inorg. Chem, vol. 33, pp. 1733-1734, 1994.

McHardy, J. et al., "Progress in Supercritical CO2 Cleaning," SAMPE Jour., vol. 29, No. 5, pp. 20-27, Sep. 1993.

Purtell, R. et al., "Precision Parts Cleaning Using Supercritical Fluids," J. Vac, Sci, Technol. A. vol. 11, No. 4, Jul. 1993, pp. 1696-1701.

Bok, E. et al., "Supercritical Fluids for Single Wafer Cleaning," Solid State Technology, pp. 117-120, Jun. 1992.

Adschiri, T. et al., "Rapid and Continuous Hydrothermal Crystallization of Metal Oxide Particles in Supercritical Water," J. Am. Ceram. Soc., vol. 75, No. 4, pp. 1019-1022, 1992.

Hansen, B.N. et al., "Supercritical Fluid Transport—Chemical Deposition of Films," Chem. Mater., vol. 4, No. 4, pp. 749-752, 1992.

Page, S.H. et al., "Predictability and Effect of Phase Behavior of CO2/ Propylene Carbonate in Supercritical Fluid Chromatography," J. Microcol, vol. 3, No. 4, pp. 355-369, 1991.

Brokamp, T. et al., "Synthese und Kristallstruktur Eines Gemischtvalenten Lithium-Tantalnitrids Li2Ta3N5," J. Alloys and Compounds, vol. 176. pp. 47-60, 1991.

Hybertson, B.M. et al., "Deposition of Palladium Films by a Novel Supercritical Fluid Transport Chemical Deposition Process," Mat. Res. Bull., vol. 26, pp. 1127-1133, 1991.

Ziger, D. H. et al., "Compressed Fluid Technology: Application to RIE-Developed Resists," AiChE Jour., vol. 33, No. 10, pp. 1585-1591, Oct. 1987.

Matson, D.W. et al., "Rapid Expansion of Supercritical Fluid Solutions: Solute Formation of Powders, Thin Films, and Fibers," Ind. Eng. Chem. Res., vol. 26, No. 11, pp. 2298-2306, 1987.

Tolley, W.K. et al., "Stripping Organics from Metal and Mineral Surfaces using Supercritical Fluids," Separation Science and Technology, vol. 22, pp. 1087-1101, 1987.

"Final Report on the Safety Assessment of Propylene Carbonate", J. American College of Toxicology, vol. 6, No. 1, pp. 23-51, 1987.

"Porous Xerogel Films as Ultra-Low Permittivity Dielectrics for ULSI Interconnect Applications", Materials Research Society, pp. 463-469, 1997.

Kawakami et al, "A Super Low-k (k=1.1) Silica Aerogel Film Using Supercritical Drying Technique", IEEE, pp. 143-145, 2000.

D. Goldfarb et al., "Aqueous-based Photoresist Drying Using Supercritical Carbon Dioxide to Prevent Pattern Collapse", J. Vacuum Sci. Tech. B 18 (6), 3313 (2000).

H. Namatsu et al., "Supercritical Drying for Water-Rinsed Resist Systems", J. Vacuum Sci. Tech. B 18 (6), 3308 (2000).

N. Sundararajan et al., "Supercritical CO2 Processing for Submicron Imaging of Fluoropolymers", Chem. Mater. 12, 41 (2000).

Matson and Smith "Supercritical Fluids", Journal of the American Ceramic Society, vol. 72, No. 6, pp. 872-874, 1989.

R.F. Reidy, "Effects of Supercritical Processing on Ultra Low-K Films", Texas Advanced Technology Program, Texas Instruments, and the Texas Academy of Mathematics and Science, 2002.

Anthony Muscat, "Backend Processing Using Supercritical CO2", University of Arizona, 2003.

* cited by examiner

TREATMENT OF A DIELECTRIC LAYER USING SUPERCRITICAL $CO_2$

CROSS-REFERENCE TO RELATED APPLICATIONS

This Patent Application is a continuation-in-part (CIP) of the U.S. patent application Ser. No. 10/379,984 filed Mar. 4, 2003 now U.S. Pat. No. 7,270,941, and entitled "METHODS OF PASSIVATING POROUS LOW-K DIELECTRIC FILM" which claims priority under 35 U.S.C. 119 (e) of the U.S. Provisional Patent Application Ser. No. 60/361,917 filed Mar. 4, 2002, and entitled "METHODS OF PASSIVATING POROUS LOW-K DIELECTRIC FILM" and the U.S. Provisional Patent Application Ser. No. 60/369,052 filed Mar. 29, 2002, and entitled "USE OF SUPERCRITICAL $CO_2$ PROCESSING FOR INTEGRATION AND FORMATION OF ULK DIELECTRICS". The co-pending U.S. patent application Ser. No. 10/379,984 filed Mar. 4, 2003, and entitled "METHODS OF PASSIVATING POROUS LOW-K DIELECTRIC FILM"; the Provisional Patent Application Ser. No. 60/361,917 filed Mar. 4, 2002, and entitled "METHODS OF PASSIVATING POROUS LOW-K DIELECTRIC FILM"; and the Provisional Patent Application Ser. No. 60/369,052 filed Mar. 29, 2002, and entitled "USE OF SUPERCRITICAL $CO_2$ PROCESSING FOR INTEGRATION AND FORMATION OF ULK DIELECTRICS" are all hereby incorporated by reference.

FIELD OF THE INVENTION

The invention in general relates to the field of semiconductor wafer processing. More particularly, the invention relates to passivating or repairing damaged porous and non-porous dielectric materials having various dielectric constants with supercritical processing solutions.

BACKGROUND OF THE INVENTION

Semiconductor fabrication generally uses photoresist in etching and other processing steps. In the etching steps, a photoresist masks areas of the semiconductor substrate that are not etched. Examples of the other processing steps include using a photoresist to mask areas of a semiconductor substrate in an ion implantation step or using the photoresist as a blanket protective coating of a processed wafer or using the photoresist as a blanket protective coating of a MEMS (micro electromechanical system) device.

State of the art integrated circuits can contain up to 6 million transistors and more than 800 meters of wiring. There is a constant push to increase the number of transistors on wafer-based integrated circuits. As the number of transistors is increased, there is a need to reduce the cross-talk between the closely packed wires in order to maintain high performance requirements. The semiconductor industry is continuously looking for new processes and new materials that can help improve the performance of wafer-based integrated circuits.

Materials exhibiting low dielectric constants of between 3.5-2.5 are generally referred to as low-k materials and porous materials with dielectric constants of 2.5 and below are generally referred to as ultra low-k (ULK) materials. For the purpose of this application low-k materials refer to both low-k and ultra low-k materials. Low-k materials have been shown to reduce cross-talk and provide a transition into the fabrication of even smaller integrated circuit geometries. Low-k materials have also proven useful for low temperature processing. For example, spin-on-glass materials (SOG) and polymers can be coated onto a substrate and treated or cured with relatively low temperatures to make porous silicon oxide-based low-k layers. Silicon oxide-based herein does not strictly refer to silicon-oxide materials. In fact, there are a number of low-k materials that have silicon oxide and hydrocarbon components and/or carbon, wherein the formula is SiOxCyHz, referred to herein as hybrid materials and designated herein as MSQ materials. It is noted, however, that MSQ is often designated to mean Methyl Silsesquioxane, which is an example of the hybrid low-k materials described above. Some low-k materials, such as carbon doped oxide (COD) or fluoridated silicon glass (FSG), are deposited using chemical vapor deposition techniques, while other low-k materials, such as MSQ, porous-MSQ, and porous silica, are deposited using a spin-on process.

While low-k materials are promising materials for fabrication of advanced micro circuitry, they also provide several challenges. They tend to be less robust than more traditional dielectric layer materials and can be damaged by etch and plasma ashing process generally used in patterning dielectric layers in wafer processing, especially in the case of the hybrid low-k materials, such as described above. Further, silicon oxide-based low-k materials tend to be highly reactive after patterning steps. The hydrophilic surface of the silicon oxide-based low-k material can readily absorb water and/or react with other vapors and/or process contaminants that can alter the electrical properties of the dielectric layer itself and/or diminish the ability to further process the wafer.

What is needed is an apparatus and method of passivating a low-k layer especially after a patterning step. Preferably, the method of passivating the low-k layer is compatible with other wafer processing steps, such as processing steps for removing contaminants and/or post-etch residue after a patterning step.

SUMMARY OF THE INVENTION

The present invention is directed to passivating silicon-oxide based low-k materials using a supercritical passivating solution. Low-k materials are usually porous oxide-based materials and can include an organic or hydrocarbon component. Examples of low-k materials include, but are not limited to, carbon-doped oxide (COD), spin-on-glass (SOG) and fluoridated silicon glass (FSG) materials.

In accordance with the embodiments of the present invention, a supercritical passivating solution comprises supercritical carbon dioxide and an amount of a passivating agent that is preferably a silylating agent. In one embodiment, the silylating agent can be introduced into supercritical carbon dioxide directly. In alternative embodiments, the silylating agent can be introduced into supercritical carbon dioxide with a carrier solvent (cosolvent), such as N,N-dimethylacetamide (DMAc), gamma-butyrolactone (BLO), dimethyl sulfoxide (DMSO), ethylene carbonate (EC), N-methylpyrrolidone (NMP), dimethylpiperidone, propylene carbonate, and alcohols (such a methanol, ethanol and 1-propanol) or combinations thereof, to generate the supercritical passivating solution.

In accordance with a preferred embodiment of the invention, the silylating agent is an organosilicon compound, and silyl groups (Si(CR3)3) attack silanol (Si—OH) groups on the surface of the silicon oxide-based low-k dielectric material and/or in the bulk of the silicon oxide-based low-k dielectric material to form surface capped organo-silyl groups during the passivating step.

In accordance with further embodiments of the invention, a silicon oxide-based low-k material is passivated with a supercritical passivating solution comprising supercritical carbon dioxide and an organosilicon compound that comprises organo-groups. In accordance with one embodiment of the invention the organo-groups or a portion thereof, are methyl groups. For example, suitable organosilicon compounds useful as silylating agents in the invention include, but are not limited to, hexamethyldisilazane (HMDS), chlorotrimethylsilane (TMCS), trichloromethylsilane (TCMS), dimethylsilyldiethylamine (DMSDEA), tetramethyldisilazane (TMDS), trimethylsilyldimethylamine (TMSDMA), dimethylsilyldimethylamine (DMSDMA), trimethylsilyldiethylamine (TMSDEA), bistrimethylsilyl urea (BTSU), bis(dimethylamino)methyl silane (B[DMA]MS), bis(dimethylamino)dimethyl silane (B[DMA]DS), HMCTS, dimethylaminopentamethyldisilane (DMAPMDS), dimethylaminodimethyldisilane (DMADMDS), disila-aza-cyclopentane (TDACP), disila-oza-cyclopentane (TDOCP), methyltrimethoxysilane (MTMOS), vinyltrimethoxysilane (VTMOS), or trimethylsilylimidazole (TMSI).

During a supercritical passivating step, a silicon oxide-based low-k material, in accordance with the embodiments of the invention, is maintained at temperatures in a range of 40 to 200 degrees Celsius, and preferably at a temperature of between approximately 50 degrees Celsius and approximately 150 degrees Celsius, and at pressures in a range of 1,070 to 9,000 psi, and preferably at a pressure between approximately 1,500 psi and approximately 3,500 psi, while a supercritical passivating solution, such as described herein, is circulated over the surface of the silicon oxide-based low-k material.

In accordance with still further embodiments of the invention, the surface of the silicon oxide-based low-k material is dried or re-treated prior to the passivating step. In accordance with this embodiment of the invention, the silicon oxide-based low-k material is dried, or re-treated by exposing the low-k materials to a supercritical solution of supercritical carbon dioxide or supercritical carbon dioxide with one or more solvents including but not limited to ethanol, methanol, n-butanol and combinations thereof. A supercritical processing solution with methanol and ethanol can be used to remove water from low-k materials. In addition, a supercritcial processing solution with one or more alcohols can be used to remove low molecular weight compounds from a porous inter-level or inter-layer dielectric (ILD).

In accordance with yet further embodiments of the invention, a dielectric surface is passivated during a cleaning processing step, wherein a post-etch residue is simultaneously removed from the dielectric surface using a supercritical cleaning solution comprising a passivating agent, such as described herein. The post-etch residue can include a photoresist polymer or a photoresist polymer with an anti-reflective dye and/or an anti-reflective layer.

In accordance with the method of the present invention, a patterned low-k dielectric layer is formed by depositing a continuous layer of a low-k dielectric material on a substrate or other surface, etching a pattern in the low-k material and passivating the patterned layer.

After a low-k material is patterned by treating the low-k material to an etch and/or ash process, the low-k material can show a marked increase in the k-values as a result of degeneration of the material and/or removal of a portion of the organic component, in the case of low-k hybrid materials; increases of more than 1.0 in k-values have been observed. The method of passivation in accordance with the present invention has the ability to restore or recover a portion of the k-value lost in the patterning steps. In fact it has been observed that low-k materials passivated in accordance with the embodiments of the present invention can be restored to exhibit k-values near, or at, k-values of the original and un-patterned material.

BRIEF DESCRIPTION OF THE DRAWINGS

A more complete appreciation of various embodiments of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

In semiconductor fabrication, a dielectric layer is generally patterned using a photoresist mask in one or more etching and ashing steps. Generally, to obtain the high-resolution line widths and high feature aspect ratios, an anti-reflective coating is required. In earlier processes, an anti-reflective coating (ARC) of titanium nitride (TiN) was vapor deposited on the dielectric layer and the TiN anti-reflective coatings would not be removed after patterning but rather remained a part of the device fabricated. With new classes of low dielectric layers that can be made to be very thin, TiN anti-reflective coatings are not preferred because anti-reflective coatings can dominate over the electrical properties of the dielectric layer. Accordingly, polymeric spin-on anti-reflective coatings with an anti-reflective dye that can be removed after a patterning step are preferred. Regardless of the materials that are used in the patterning steps, after patterning the dielectric layer these materials are preferably removed from the dialectic layer after the patterning process is complete.

Porous low-k materials are most commonly silicon-oxide based with silanol (Si—OH) groups and/or organo components as described above. These low-k materials can become activated and/or damaged, which is believed to be in part due to depletion of an organic component during etch and/or ash steps. In either case, of activation and/or damage, additional silanol groups are exposed which can readily adsorb water and/or contaminants and/or chemicals that are present during other processing steps. Accordingly, partial device structures with exposed low-k dielectric layers are difficult to handle and maintain contaminant free, especially after patterning steps. Further, activation and/or damage of the bulk low-k material can result in increased k-values. It has been observed that low-k materials that are activated and/or damaged can exhibit increases in k-values by 1.0 or more.

The present invention is directed to a method of and system for passivating porous low-k dielectric materials. The method of the present invention preferably passivates a layer of patterned low-k layer by end-capping silanol groups on the surface and/or in the bulk of the low-k material to produce a patterned low-k material that is more hydrophobic, more resistant to hydrophilic contamination, and/or less reactive. In accordance with the embodiments of the present invention, a passivation processing step is carried out separately from a supercritical post-etch cleaning process or, alternatively, is carried out simultaneously with a supercritical post-etch cleaning process.

Figure 1A:
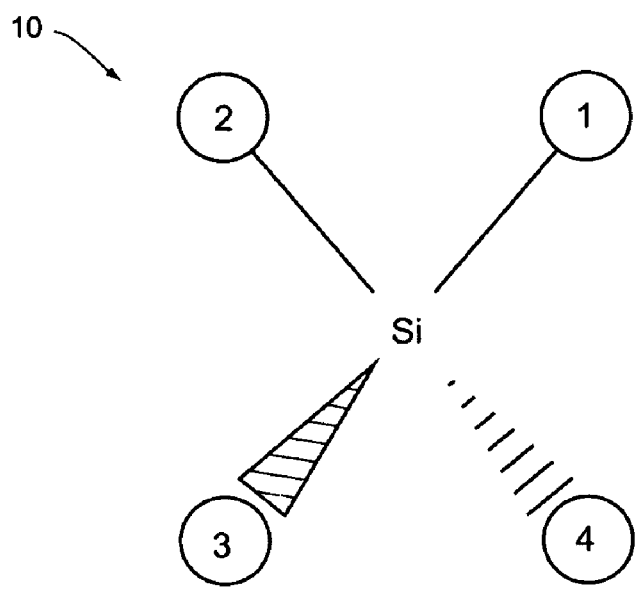
FIGS. 1A-C show schematic representations of organosilicon structures used as silylating agents in a supercritical processing step, in accordance with the embodiments of the invention.

Referring now to FIG. 1A, in accordance with the embodiments of the invention, a supercritical passivating solution comprises a silane structure 10 which can have all organo groups, such as in the case with hexamethyldisilazane (HMDS) or a combination of organo and halide groups (F, Cl, Br and etc.) which are attached to any one of the positions 1-4.

Figure 1B:
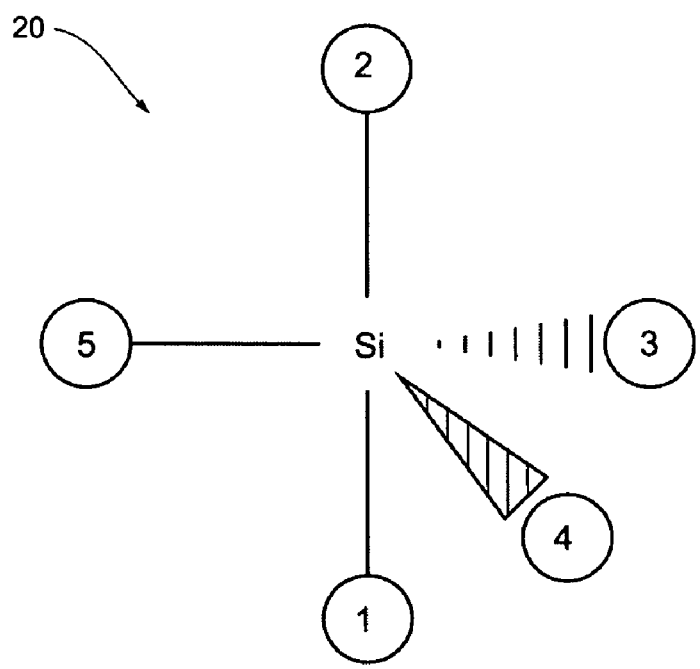

Now referring to FIG. 1B, in accordance with further embodiments of the invention, a supercritical passivating solution comprises a pent-valent organosilicon compound 20, wherein the silicon atom is coordinated to 5 ligands in the positions 1, 2, 3, 4 and 5 in a tiganolbipyramidal configuration. Typically, such compounds 20 are anions with one or more of the positions 1-5 being coordinated with a halide atom, such as in the case with a difluorotrimethylilicate anion. When the structure 20 is an anion, the compound 20 also includes a suitable cation, such as sodium, potassium or any other inorganic or organic cation (not shown).

Figure 1C:
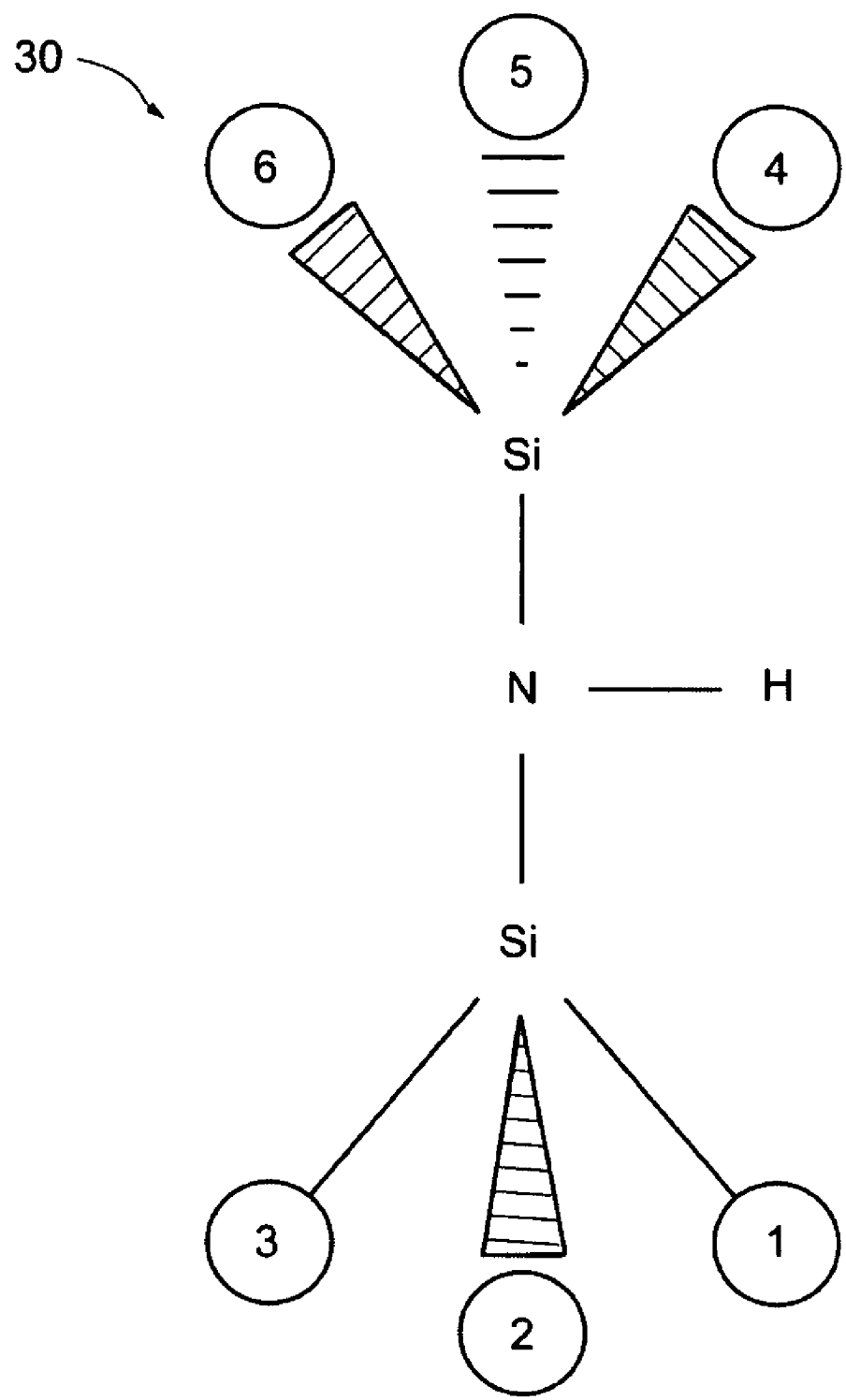

Now referring to FIG. 1C, in accordance with yet further embodiments of the present invention, a supercritical passivating solution comprises a silazane structure 30, which can be described as an amine structure with two organosilyl groups coordinated to the nitrogen of the amine, such as in the case of hexamethyldisilazane (HMDS) or a combination of organo and halide groups (F, Cl, Br, etc.), which are attached to any one of the positions 1-6.

Figure 1D:
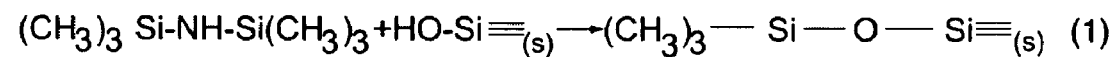
FIG. 1D shows schematic representations of silylating agents reacting with silanol groups in a low-k material, in accordance with the embodiments of the invention.
Figure 1D:
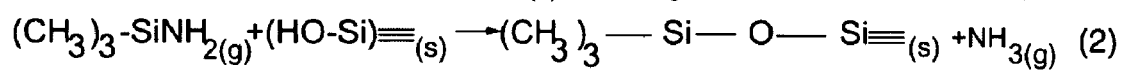

FIG. 1D shows schematic representations of hexamethyldisilazane (HMDS) reacting with silanol groups on a surface of a low-k material in reaction sequence (1). For example, a trimethyl amine can be produced in the reaction sequence (1), which can then further react with silanol groups on a surface of the low-k material in accordance with reaction sequence (2). Hence, hexamethyldisilazane (HMDS) provides an excellent sylylating agent for use in accordance with the method of the present invention.

Figure 1E:
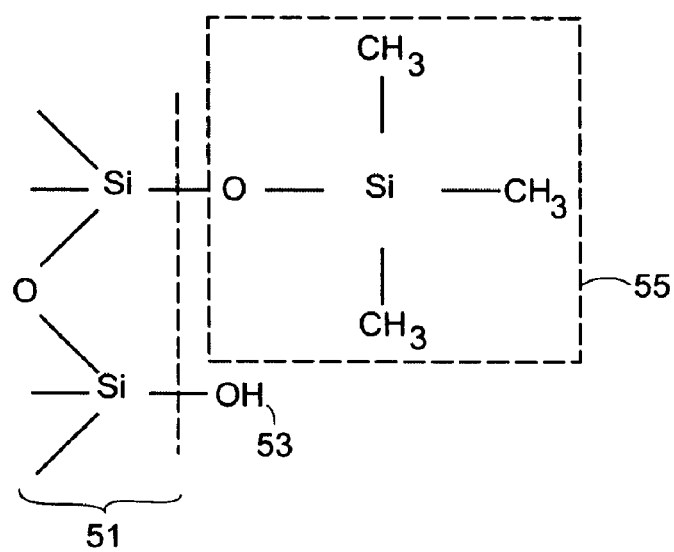
FIG. 1E illustrates steric hindrance between a silanol-group and a silyl-group on a surface of a low-k material, which can lead to incomplete silylating of the surface.

FIG. 1E illustrates steric hindrance between a silanol group 53 and silyl-group 55 on a surface 51 of a low-k material. Note that the silyl group 55 is extremely large and can actually provide a protective barrier for the silanol group 53. Accordingly, it is not generally possible to completely silylate an entire surface or bulk of a low-k material.

It will be clear to one skilled in the art that a supercritical passivating solution with any number of silylating agents and combinations of silylating agents are within the scope of the present invention. Further, the silylating agent or agents used can be introduced into supercritical carbon dioxide neat or along with a carrier solvent, such as N,N-dimethylacetamide (DMAc), gamma-butyrolactone (BLO), dimethyl sulfoxide (DMSO), ethylene carbonate (EC) N-methylpyrrolidone (NMP), dimethylpiperidone, propylene carbonate, alkane or combinations thereof to generate the supercritical passivating solution. In addition, cleaning and/or rinsing agents used in the present invention can be used in supercritical cleaning/rinsing processes to remove post-processing residues from a surface of a patterned low-k material.

The present invention is particularly well suited for removing post-etch photopolymers from a wafer material and even more specifically is well suited to remove a post-etch photopolymer and/or a polymeric anti-reflective coating layer from a low-k silicon oxide-based layer, including low-k layers formed from porous MSQ and porous SiO2 (e.g., Honeywell's NANOGLASS®), while simultaneously passivating a silicon oxide-based layer.

Figure 2:
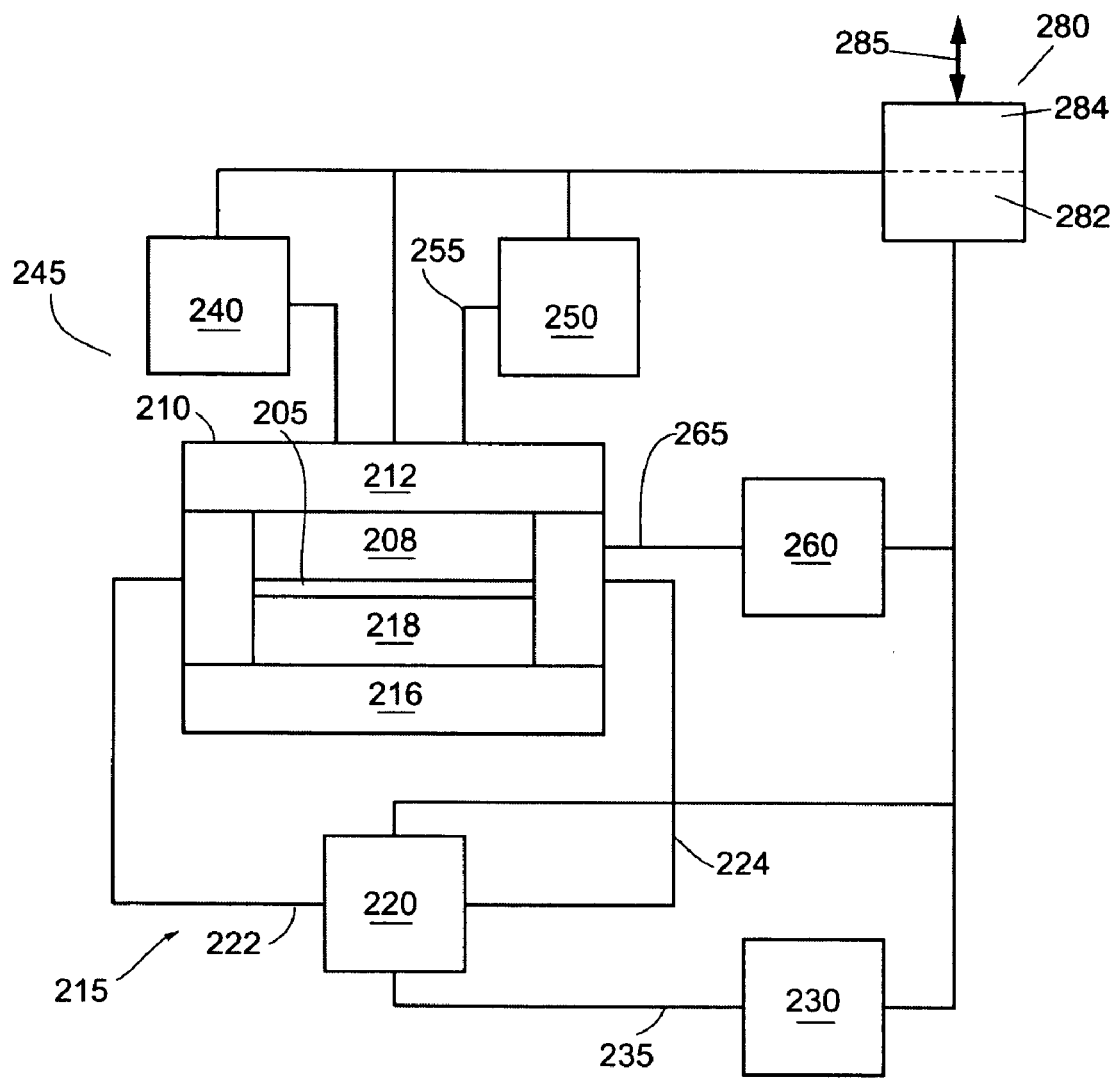
FIG. 2 shows an exemplary block diagram of a processing system in accordance with an embodiment of the invention.

FIG. 2 shows an exemplary block diagram of a processing system in accordance with an embodiment of the invention. In the illustrated embodiment, processing system 200 comprises a process module 210, a recirculation system 220, a process chemistry supply system 230, a high-pressure fluid supply system 240, a pressure control system 250, an exhaust control system 260, and a controller 280. The processing system 200 can operate at pressures that can range from 1,000 psi. to 10,000 psi. In addition, the processing system 200 can operate at temperatures that can range from 40 to 300 degrees Celsius.

The details concerning one example of a process chamber are disclosed in co-owned and co-pending U.S. patent application Ser. No. 09/912,844, entitled "HIGH PRESSURE PROCESSING CHAMBER FOR SEMICONDUCTOR SUBSTRATE," filed Jul. 24, 2001, Ser. No. 09/970,309, entitled "HIGH PRESSURE PROCESSING CHAMBER FOR MULTIPLE SEMICONDUCTOR SUBSTRATES," filed Oct. 3, 2001, Ser. No. 10/121,791, entitled "HIGH PRESSURE PROCESSING CHAMBER FOR SEMICONDUCTOR SUBSTRATE INCLUDING FLOW ENHANCING FEATURES," filed Apr. 10, 2002, and Ser. No. 10/364,284, entitled "HIGH-PRESSURE PROCESSING CHAMBER FOR A SEMICONDUCTOR WAFER," filed Feb. 10, 2003, the contents of which are all incorporated herein by reference.

The controller 280 can be coupled to the process module 210, the recirculation system 220, the process chemistry supply system 230, the high-pressure fluid supply system 240, the pressure control system 250, and the exhaust control system 260. Alternatively, controller 280 can be coupled to one or more additional controllers/computers (not shown), and controller 280 can obtain setup and/or configuration information from an additional controller/computer.

In FIG. 2, singular processing elements (210, 220, 230, 240, 250, 260, and 280) are shown, but this is not required for the invention. The semiconductor processing system 200 can comprise any number of processing elements having any number of controllers associated with them in addition to independent processing elements.

The controller 280 can be used to configure any number of processing elements (210, 220, 230, 240, 250, and 260), and the controller 280 can collect, provide, process, store, and display data from processing elements. The controller 280 can comprise a number of applications for controlling one or more of the processing elements. For example, controller 280 can include a GUI component (not shown) that can provide easy-to-use interfaces that enable a user to monitor and/or control one or more processing elements.

The process module 210 can include an upper assembly 212 and a lower assembly 216, and the upper assembly 212 can be coupled to the lower assembly 216 to form a process chamber 208. In an alternative embodiment, a frame and or injection ring may be included and may be coupled to the upper assembly 212 and the lower assembly 216. The upper assembly 212 can comprise a heater (not shown) for heating the process chamber 208, a substrate 205 contained within the process chamber 208, or a processing fluid, or a combination of two or more thereof. Alternatively, a heater is not required in the upper assembly 212. In another embodiment, the lower assembly 216 can comprise a heater (not shown) for heating the process chamber 208, the substrate 205, or the processing fluid, or a combination of two or more thereof. The process module 210 can include means for flowing a processing fluid through the process chamber 208. In one example, a circular flow pattern can be established, and in another example, a substantially linear flow pattern can be established. Alternatively, the means for flowing can be configured differently. The lower assembly 216 can comprise one or more lifters (not shown) for moving a holder or chuck 218 and/or the substrate 105. Alternatively, a lifter is not required.

In one embodiment, the process module 210 can include the holder or chuck 218 for supporting and holding the substrate 205 while processing the substrate 205. The holder or chuck 218 can also be configured to heat or cool the substrate 205 before, during, and/or after processing the substrate 205. Alternatively, the process module 210 can include a platen for supporting and holding the substrate 205 while processing the substrate 205.

A transfer system (not shown) can be used to move a substrate (e.g., 205) into and out of the process chamber 208 through a slot (not shown). In one example, the slot can be opened and closed by moving the chuck, and in another example, the slot can be controlled using a gate valve.

The substrate can include semiconductor material, metallic material, dielectric material, ceramic material, or polymer material, or a combination of two or more thereof. The semiconductor material can include Si, Ge, Si/Ge, or GaAs. The metallic material can include Cu, Al, Ni, Pb, Ti, Ta, or W, or combinations of two or more thereof. The dielectric material can include Si, O, N, or C, or combinations of two or more thereof. The ceramic material can include Al, N, Si, C, or O, or combinations of two or more thereof.

The recirculation system 220 can be coupled to the process module 210 using one or more inlet lines 222 and one or more outlet lines 224. In one embodiment, a recirculation loop 215 can be configured that includes a portion of the recirculation system 220, a portion of the process module 210, one or more of the inlet lines 222 and one or more of the outlet lines 224.

The recirculation system 220 can comprise one or more pumps (not shown) that can be used to regulate the flow of the supercritical processing solution through the process chamber 208 and the other elements in the recirculation loop 215. The flow rate can vary from approximately 0.01 liters/minute to approximately 100 liters/minute.

The recirculation system 220 can comprise one or more valves for regulating the flow of a supercritical processing solution through the recirculation system and through the process module 210. The recirculation system 220 can comprise any number of back-flow valves, filters, pumps, and/or heaters (not shown) for maintaining a supercritical processing solution and flowing the supercritical process solution through the recirculation system 220 and through the process chamber 208 in the process module 210.

Processing system 200 can comprise a process chemistry supply system 230. In the illustrated embodiment, the process chemistry supply system 230 is coupled to the recirculation system 220 using one or more lines 235, but this is not required for the invention. In alternative embodiments, the process chemistry supply system 230 can be configured differently and can be coupled to different elements in the processing system 200. For example, the process chemistry supply system 230 can be directly coupled to the process module 210.

Process chemistry is introduced by the process chemistry supply system 230 into the fluid introduced by the high-pressure fluid supply system 240 at ratios that vary with the substrate properties, the chemistry being used, and the process being performed in the process chamber 208. The ratio can vary from approximately 0.001 to approximately 15 percent by volume. For example, when the recirculation loop 215 comprises a volume of about one liter, the process chemistry volumes can range from approximately ten micro liters to approximately one hundred fifty milliliters. In alternative embodiments, the volume and/or the ratio may be higher or lower.

The process chemistry supply system 230 can comprise a cleaning chemistry assembly (not shown) for providing cleaning chemistry for generating supercritical cleaning solutions within the process chamber 208. The cleaning chemistry can include peroxides and a fluoride source. Further details of fluoride sources and methods of generating supercritical processing solutions with fluoride sources are described in U.S. patent application Ser. No. 10/442,557, filed May 20, 2003, and titled "TETRA-ORGANIC AMMONIUM FLUORIDE AND HF IN SUPERCRITICAL FLUID FOR PHOTORESIST AND RESIDUE REMOVAL", and U.S. patent application Ser. No. 10/321,341, filed Dec. 26, 2002, and titled "FLUORIDE 1N SUPERCRITICAL FLUID FOR PHOTORESIST POLYMER AND RESIDUE REMOVAL," both incorporated by reference herein.

In addition, the cleaning chemistry can include chelating agents, complexing agents, oxidants, organic acids, and inorganic acids that can be introduced into supercritical carbon dioxide with one or more carrier solvents, such as N,N-dimethylacetamide (DMAc), gamma-butyrolactone (BLO), dimethyl sulfoxide (DMSO), ethylene carbonate (EC), N-methylpyrrolidone (NMP), dimethylpiperidone, propylene carbonate, and alcohols (such as methanol, ethanol and 2-propanol).

The process chemistry supply system 230 can comprise a rinsing chemistry assembly (not shown) for providing rinsing chemistry for generating supercritical rinsing solutions within the process chamber 208. The rinsing chemistry can include one or more organic solvents including, but not limited to, alcohols and ketones. For example, the rinsing chemistry can comprise solvents, such as N,N-dimethylacetamide (DMAc), gamma-butyrolactone (BLO), dimethyl sulfoxide (DMSO), ethylene carbonate (EC), N-methylpyrrolidone (NMP), dimethylpiperidone, propylene carbonate, and alcohols (such as methanol, ethanol and 2-propanol).

Furthermore, the process chemistry supply system 230 can be configured to introduce treating chemistry for curing, cleaning, healing (or restoring the dielectric constant of low-k materials), or sealing, or any combination of low dielectric constant films (porous or non-porous). The chemistry can include hexamethyldisilazane (HMDS), chlorotrimethylsilane (TMCS), trichloromethylsilane (TCMS), dimethylsilyldiethylamine (DMSDEA), tetramethyldisilazane (TMDS), trimethylsilyldimethylamine (TMSDMA), dimethylsilyidimethylamine (DMSDMA), trimethylsilyldiethylamine (TMSDEA), bistrimethylsilyl urea (BTSU), bis(dimethylamino)methyl silane (B[DMA]MS), bis (dimethylamino)dimethyl silane (B[DMA]DS), HMCTS, dimethylaminopentamethyldisilane (DMAPMDS), dimethylaminodimethyldisilane (DMADMDS), disila-aza-cyclopentane (TDACP), disila-oza-cyclopentane (TDOCP), methyltrimethoxysilane (MTMOS), vinyltrimethoxysilane (VTMOS), or trimethylsilylimidazole (TMSI). Additionally, the chemistry may include N-tert-butyl-1,1-dimethyl-1-(2,3,4,5-tetramethyl-2,4-cyclopentadiene-1-yl)silanamine, 1,3- diphenyl-1,1,3,3-tetramethyldisilazane, or tert-butylchlorodiphenylsilane. For further details, see U.S. patent application Ser. No. 10/682,196, filed Oct. 10, 2003, and titled "METHOD AND SYSTEM FOR TREATING A DIELECTRIC FILM", and U.S. patent application Ser. No. 10/379,984, filed Mar. 4, 2003, and titled "METHOD OF PASSIVATING LOW DIELECTRIC MATERIALS IN WAFER PROCESSING", both incorporated by reference herein.

The processing system 200 can comprise the high-pressure fluid supply system 240. As shown in FIG. 2, the high-pressure fluid supply system 240 can be coupled to the recirculation system 220 using one or more lines 245, but this is not required. The inlet line 245 can be equipped with one or more back-flow valves, and/or heaters (not shown) for controlling the fluid flow from the high-pressure fluid supply system 240. In alternative embodiments, high-pressure fluid supply system 240 can be configured differently and coupled differently. For example, the high-pressure fluid supply system 240 can be coupled to the process module 210 or to the recirculation system 220 or to both.

The high-pressure fluid supply system 240 can comprise a carbon dioxide source (not shown) and a plurality of flow control elements (not shown) for generating a supercritical fluid. For example, the carbon dioxide source can include a $CO_2$ feed system, and the flow control elements can include supply lines, valves, filters, pumps, and heaters. The high-pressure fluid supply system 240 can comprise an inlet valve (not shown) that is configured to open and close to allow or prevent the stream of supercritical carbon dioxide from flowing into the process chamber 208. For example, controller 280 can be used to determine fluid parameters such as pressure, temperature, process time, and flow rate.

The processing system 200 can also comprise a pressure control system 250. As shown in FIG. 2, the pressure control system 250 can be coupled to the process module 210 using one or more lines 255, but this is not required. Line 255 can be equipped with one or more back-flow valves, pumps, and/or heaters (not shown) for controlling the fluid flow to pressure control system 250. In alternative embodiments, pressure control system 250 can be configured differently and coupled differently. For example, the pressure control system 250 can also include one or more pumps (not shown), and a sealing means (not shown) for sealing the process chamber 208. In addition, the pressure control system 250 can comprise means for raising and lowering the substrate 205 and/or the chuck 218. The pressure control system 250 can include one or more pressure valves (not shown) for exhausting the process chamber 208 and/or for regulating the pressure within the process chamber 208. Alternatively, the pressure control system 250 can also include one or more pumps (not shown).

Furthermore, the processing system 200 can comprise an exhaust control system 260. As shown in FIG. 2, the exhaust control system 260 can be coupled to the process module 210 using one or more lines 265, but this is not required. Line 255 can be equipped with one or more back-flow valves, and/or heaters (not shown) for controlling the fluid flow to the exhaust control system 260. In alternative embodiments, exhaust control system 260 can be configured differently and coupled differently. The exhaust control system 260 can include an exhaust gas collection vessel (not shown) and can be used to remove contaminants from the processing fluid. Alternatively, the exhaust control system 260 can be used to recycle the processing fluid.

In one embodiment, controller 280 can comprise a processor 282 and a memory 284. Memory 284 can be coupled to processor 282, and can be used for storing information and instructions to be executed by processor 282. Alternatively, different controller configurations can be used. In addition, controller 280 can comprise a port 285 that can be used to couple processing system 200 to another system (not shown). Furthermore, controller 280 can comprise input and/or output devices (not shown).

In addition, one or more of the processing elements (210, 220, 230, 240, 250, 260, and 280) may include memory (not shown) for storing information and instructions to be executed during processing and processors for processing information and/or executing instructions. For example, the memory 284 may be used for storing temporary variables or other intermediate information during the execution of instructions by the various processors in the system. One or more of the processing elements can comprise a means for reading data and/or instructions from a computer readable medium. In addition, one or more of the processing elements can comprise a means for writing data and/or instructions to a computer readable medium.

Memory devices can include at least one computer readable medium or memory for holding computer-executable instructions programmed according to the teachings of the invention and for containing data structures, tables, records, or other data described herein.

The processing system 200 can perform a portion or all of the processing steps of the invention in response to the controller 280 executing one or more sequences of one or more computer-executable instructions contained in the memory 284. Such instructions may be received by the controller 280 from another computer, a computer readable medium, or a network connection.

Stored on any one or on a combination of computer readable media, the present invention includes software for controlling the processing system 200, for driving a device or devices for implementing the invention, and for enabling the processing system 200 to interact with a human user and/or another system, such as a factory system. Such software may include, but is not limited to, device drivers, operating systems, development tools, and applications software. Such computer readable media further includes the computer program product of the present invention for performing all or a portion (if processing is distributed) of the processing performed in implementing the invention.

The term "computer readable medium" as used herein refers to any medium that participates in providing instructions to a processor for execution and/or that participates in storing information before, during, and/or after executing an instruction. A computer readable medium may take many forms, including, but not limited to, non-volatile media, volatile media, and transmission media. The term "computer-executable instruction" as used herein refers to any computer code and/or software that can be executed by a processor, that provides instructions to a processor for execution and/or that participates in storing information before, during, and/or after executing an instruction.

Controller 280, processor 282, memory 284 and other processors and memory in other system elements as described thus far can, unless indicated otherwise below, be constituted by components known in the art or constructed according to principles known in the art. The computer readable medium and the computer executable instructions can also, unless indicated otherwise below, be constituted by components known in the art or constructed according to principles known in the art.

Controller 280 can use port 285 to obtain computer code and/or software from another system (not shown), such as a factory system. The computer code and/or software can be used to establish a control hierarchy. For example, the processing system 200 can operate independently, or can be controlled to some degree by a higher-level system (not shown).

The controller 280 can receive data from and/or send data to the other parts of the system 200. Controller 280 can use pre-process data, process data, and post-process data. For example, pre-process data can be associated with an incoming substrate. This pre-process data can include lot data, batch data, run data, composition data, and history data. The pre-process data can be used to establish an input state for a wafer. Process data can include process parameters. Post processing data can be associated with a processed substrate.

The controller 280 can use the pre-process data to predict, select, or calculate a set of process parameters to use to process the substrate 205. For example, this predicted set of process parameters can be a first estimate of a process recipe. A process model can provide the relationship between one or more process recipe parameters or set points and one or more process results. A process recipe can include a multi-step process involving a set of process modules. Post-process data can be obtained at some point after the substrate has been processed. For example, post-process data can be obtained after a time delay that can vary from minutes to days. The controller 280 can compute a predicted state for the substrate 205 based on the pre-process data, the process characteristics, and a process model. For example, a cleaning rate model can be used along with a contaminant level to compute a predicted cleaning time. Alternatively, a rinse rate model can be used along with a contaminant level to compute a processing time for a rinse process.

It will be appreciated that the controller 280 can perform other functions in addition to those discussed here. The controller 280 can monitor the pressure, temperature, flow, or other variables associated with the processing system 200 and take actions based on these values. For example, the controller 280 can process measured data, display data and/or results on a GUI screen, determine a fault condition, determine a response to a fault condition, and alert an operator. The controller 280 can comprise a database component (not shown) for storing input and output data.

In a supercritical cleaning/rinsing process, the desired process result can be a process result that is measurable using an optical measuring device, such as a scanning electron microscope (SEM) and/or a transmission electron microscope (TEM). For example, the desired process result can be an amount of residue and/or contaminant in a via or on the surface of a substrate below a predetermined threshold. After one or more cleaning process run, the desired process can be measured. In other case the desired process result can be a required dielectric constant.

Figure 3:
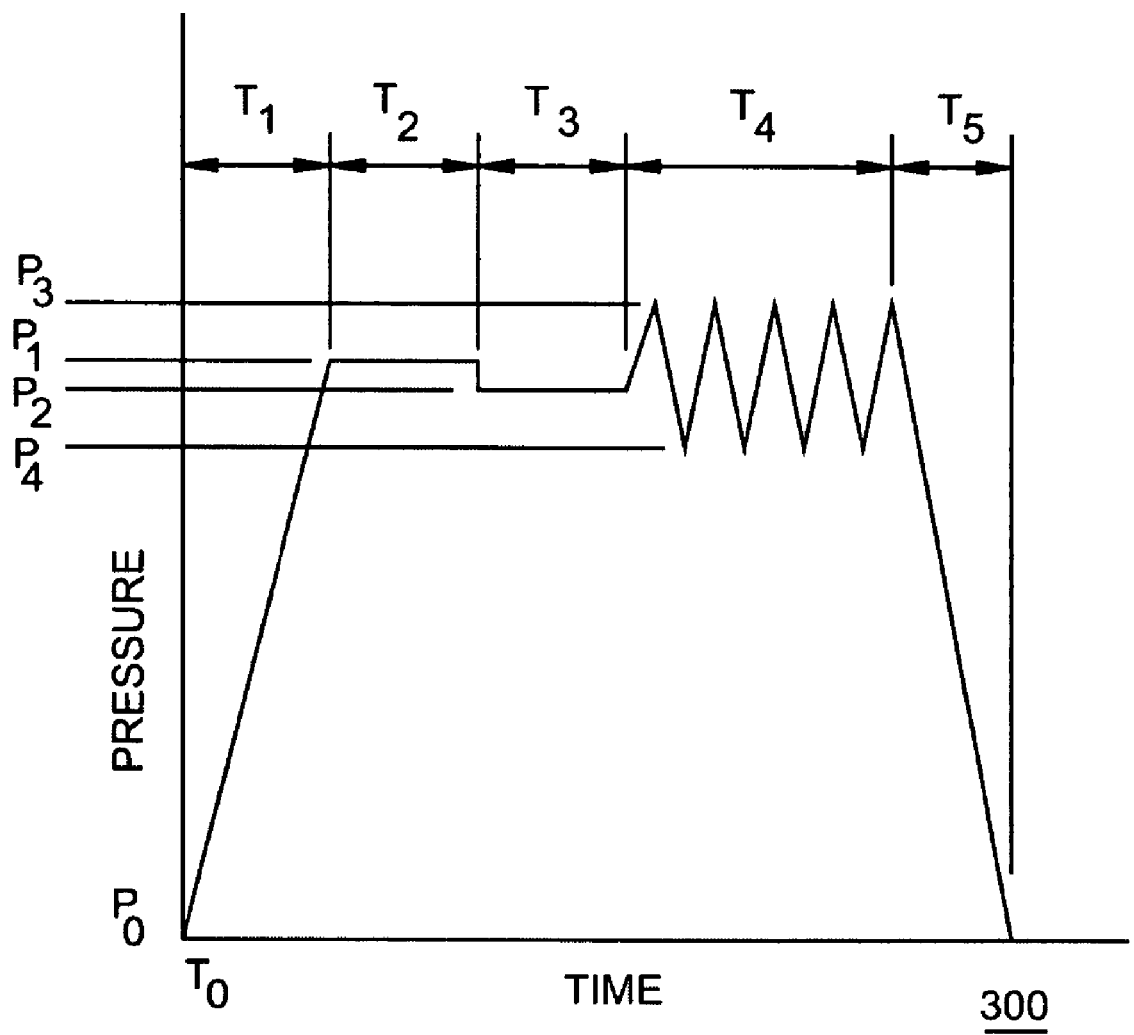
FIG. 3 illustrates an exemplary graph of pressure versus time for a supercritical process in accordance with an embodiment of the invention.

FIG. 3 illustrates an exemplary graph 300 of pressure versus time for a supercritical process step in accordance with an embodiment of the invention. In the illustrated embodiment, the graph 300 of pressure versus time is shown, and the graph 300 can be used to represent a supercritical cleaning process step, a supercritical rinsing process step, or a supercritical curing process step, or a combination thereof. Alternatively, different pressures, different timing, and different sequences may be used for different processes.

Now referring to both FIGS. 2 and 3, prior to an initial time $T_0$, the substrate 205 to be processed can be placed within the process chamber 208 and the process chamber 208 can be sealed. For example, during cleaning and/or rinsing processes, a substrate can have post-etch and/or post-ash residue thereon. The substrate 205, the process chamber 208, and the other elements in the recirculation loop 215 (FIG. 2) can be heated to an operational temperature. For example, the operational temperature can range from 40 to 300 degrees Celsius. For example, the process chamber 208, the recirculation system 220, and piping coupling the recirculation system 220 to the process chamber 208 can form the recirculation loop 215.

From the initial time $T_0$ through a first duration of time $T_1$, the elements in the recirculation loop 215 (FIG. 2) can be pressurized. As illustrated in the embodiment shown in FIG. 3, from the time $T_0$ during the first duration of time $T_1$, the pressure is increased from $P_0$ to $P_1$. During a first portion of the time $T_1$, a temperature-controlled fluid can be provided into the recirculation loop 215 (FIG. 2). In one embodiment, the high-pressure fluid supply system 240 can be operated during a pressurization process and can be used to fill the recirculation loop 215 with temperature-controlled fluid. The high-pressure fluid supply system 240 can comprise means for filling the recirculation loop 215 with the temperature-controlled fluid, and the temperature variation of the temperature-controlled fluid can be controlled to be less than approximately 10 degrees Celsius during the pressurization process. Alternatively, the temperature variation of the temperature-controlled fluid can be controlled to be less than approximately 5 degrees Celsius during the pressurization process. In alternative embodiments, the high-pressure fluid supply system 240 and/or the pressure control system 250 can be operated during a pressurization process and can be used to fill the recirculation loop 215 with temperature-controlled fluid.

For example, a supercritical fluid, such as substantially pure $CO_2$, can be used to pressurize the elements in the recirculation loop 215 (FIG. 2). During time $T_1$, a pump (not shown) in the recirculation system 220 (FIG. 2) can be started and can be used to circulate the temperature controlled fluid through the process chamber 208 and the other elements in the recirculation loop 215 (FIG. 2).

In one embodiment, when the pressure in the process chamber 208 reaches an operational pressure $P_o$ (approximately 2,500 psi), process chemistry can be injected into the process chamber 208, using the process chemistry supply system 230. In an alternative embodiment, process chemistry can be injected into the process chamber 208, using the process chemistry supply system 230 when the pressure in the process chamber 208 exceeds a critical pressure, such as 1,070 psi. In other embodiments, process chemistry may be injected into the process chamber 208 before the pressure exceeds the critical pressure Pc using the process chemistry supply system 230. In other embodiments, process chemistry is not injected during the $T_1$ period.

In one embodiment, process chemistry is injected in a linear fashion (e.g., at regular time intervals, at a steady rate, at a steadily increasing rate, etc.), and the injection time can be based on a recirculation time. For example, the recirculation time can be determined based on the length of a recirculation path and the flow rate. In other embodiments, process chemistry may be injected in a non-linear fashion (e.g., at non-regular time intervals or at a varying rate). For example, process chemistry can be injected in one or more steps.

The process chemistry can include a cleaning agent, a rinsing agent, or a curing agent, or a combination thereof that is injected into the supercritical fluid. One or more injections of process chemistries can be performed over the duration of time $T_1$ to generate a supercritical processing solution with the desired concentrations of chemicals. The process chemistry, in accordance with the embodiments of the invention, can also include one more or more carrier solvents.

When dielectric material is being treated, the process chemistry can include a passivating agent and a solvent that is injected into the supercritical fluid. The processing chemistry preferably includes hexamethyldisilazane (HMDS), chlorotrimethylsilane (TMCS), trichloromethylsilane (TMCS) and combinations thereof. The processing chemistry can also include one or more carrier solvents.

Still referring to both FIGS. 2 and 3, during a second time $T_2$, the supercritical processing solution can be re-circulated over the substrate 205 and through the process chamber 208 using the recirculation system 220, such as described above. In one embodiment, the process chemistry supply system 230 can be switched off, and process chemistry is not injected into the recirculation loop 215 during the second time $T_2$. Alternatively, the process chemistry supply system 230 may be switched on one or more times during $T_2$, and process chemistry may be injected into the process chamber 208 during the second time $T_2$ or after the second time $T_2$.

The process chamber 208 can operate at a pressure above 1,500 psi during the second time $T_2$. For example, the pressure can range from approximately 2,500 psi to approximately 3,100 psi, but can be any value so long as the operating pressure is sufficient to maintain supercritical conditions. As illustrated in the embodiment of FIG. 3, during the second time $T_2$ the pressure is maintained at approximately $P_1$. The supercritical processing solution is circulated over the substrate 205 and through the process chamber 208 using the recirculation system 220, such as described above. The supercritical conditions within the process chamber 208 and the other elements in the recirculation loop 215 (FIG. 2) are maintained during the second time $T_2$, and the supercritical processing solution continues to be circulated over the substrate 205 and through the process chamber 208 and the other elements in the recirculation loop 215 (FIG. 2). The recirculation system 220 (FIG. 2) can be used to regulate the flow of the supercritical processing solution through the process chamber 208 and the other elements in the recirculation loop 215 (FIG. 2).

Still referring to both FIGS. 2 and 3, during a third time $T_3$, one or more push-through processes can be performed. As illustrated in the embodiment of FIG. 3, during the third time $T_3$, the pressure is maintained at approximately $P_2$. In one embodiment, the high-pressure fluid supply system 240 can be operated during a push-through process and can be used to fill the recirculation loop 215 with temperature-controlled fluid. The high-pressure fluid supply system 240 can comprise means for providing a first volume of temperature-controlled fluid during a push-through process, and the first volume can be larger than the volume of the recirculation loop 215. Alternatively, the first volume can be less than or approximately equal to the volume of the recirculation loop 215. In addition, the temperature differential within the first volume of temperature-controlled fluid during the push-through process can be controlled to be less than approximately 10 degrees Celsius. Alternatively, the temperature variation of the temperature-controlled fluid can be controlled to be less than approximately 5 degrees Celsius during a push-through process.

In other embodiments, the high-pressure fluid supply system 240 can comprise means for providing one or more volumes of temperature controlled fluid during a push-through process; each volume can be larger than the volume of the process chamber 208 or the volume of the recirculation loop 215; and the temperature variation associated with each volume can be controlled to be less than 10 degrees Celsius.

For example, during the third time $T_3$, one or more volumes of temperature controlled supercritical carbon dioxide can be fed into the process chamber 208 and the other elements in the recirculation loop 215 from the high-pressure fluid supply system 240, and the supercritical cleaning solution along with process residue suspended or dissolved therein can be displaced from the process chamber 208 and the other elements in the recirculation loop 215 through the exhaust control system 260. In an alternative embodiment, supercritical carbon dioxide can be fed into the recirculation system 220 from the high-pressure fluid supply system 240, and the supercritical cleaning solution along with process residue suspended or dissolved therein can also be displaced from the process chamber 208 and the other elements in the recirculation loop 215 through the exhaust control system 260.

Providing temperature-controlled fluid during the push-through process prevents process residue suspended or dissolved within the fluid being displaced from the process chamber 208 and the other elements in the recirculation loop 215 from dropping out and/or adhering to the process chamber 208 and the other elements in the recirculation loop 215. In addition, during the third time $T_3$, the temperature of the fluid supplied by the high-pressure fluid supply system 240 can vary over a wider temperature range than the range used during the second time $T_2$.

In the illustrated embodiment shown in FIG. 3, a single second time $T_2$ is followed by a single third time $T_3$, but this is not required. In alternative embodiments, other time sequences may be used to process a substrate.

After the push-through process is complete, a pressure cycling process can be performed. Alternatively, one or more pressure cycles can occur during the push-through process. In other embodiments, a pressure cycling process is not required. During a fourth time $T_4$, the process chamber 208 can be cycled through a plurality of decompression and compression cycles. The pressure can be cycled between a first pressure $P_3$ and a second pressure $P_4$ one or more times. In alternative embodiments, the first pressure $P_3$ and the second pressure $P_4$ can vary. In one embodiment, the pressure can be lowered by venting through the exhaust control system 260. For example, this can be accomplished by lowering the pressure to below approximately 1,500 psi and raising the pressure to above approximately 2,500 psi. The pressure can be increased by using the high-pressure fluid supply system 240 and/or the pressure control system 250 to provide additional high-pressure fluid.

The high-pressure fluid supply system 240 and/or the pressure control system 250 can comprise means for providing a first volume of temperature-controlled fluid during a compression cycle, and the first volume can be larger than the volume of the recirculation loop 215. Alternatively, the first volume can be less than or approximately equal to the volume of the recirculation loop 215. In addition, the temperature differential within the first volume of temperature-controlled fluid during the compression cycle can be controlled to be less than approximately 10 degrees Celsius. Alternatively, the temperature variation of the temperature-controlled fluid can be controlled to be less than approximately 5 degrees Celsius during a compression cycle.

In addition, the high-pressure fluid supply system 240 and/or the pressure control system 250 can comprise means for providing a second volume of temperature-controlled fluid during a decompression cycle, and the second volume can be larger than the volume of the recirculation loop 215. Alternatively, the second volume can be less than or approximately equal to the volume of the recirculation loop 215. In addition, the temperature differential within the second volume of temperature-controlled fluid during the decompression cycle can be controlled to be less than approximately 10 degrees Celsius. Alternatively, the temperature variation of the temperature-controlled fluid can be controlled to be less than approximately 5 degrees Celsius during a decompression cycle.

In other embodiments, the high-pressure fluid supply system 240 and/or the pressure control system 250 can comprise means for providing one or more volumes of temperature controlled fluid during a compression cycle and/or decompression cycle; each volume can be larger than the volume of the process chamber 208 or the volume of the recirculation loop 215; the temperature variation associated with each volume can be controlled to be less than 10 degrees Celsius; and the temperature variation can be allowed to increase as additional cycles are performed.

Furthermore, during the fourth time $T_4$, one or more volumes of temperature controlled supercritical carbon dioxide can be fed into the process chamber 208 and the other elements in the recirculation loop 215, and the supercritical cleaning solution along with process residue suspended or dissolved therein can be displaced from the process chamber 208 and the other elements in the recirculation loop 215 through the exhaust control system 260. In an alternative embodiment, supercritical carbon dioxide can be fed into the recirculation system 220, and the supercritical cleaning solution along with process residue suspended or dissolved therein can also be displaced from the process chamber 208 and the other elements in the recirculation loop 215 through the exhaust control system 260.

Providing temperature-controlled fluid during the pressure cycling process prevents process residue suspended or dissolved within the fluid being displaced from the process chamber 208 and the other elements in the recirculation loop 215 from dropping out and/or adhering to the process chamber 208 and the other elements in the recirculation loop 215. In addition, during the fourth time $T_4$, the temperature of the fluid supplied can vary over a wider temperature range than the range used during the second time $T_2$.

In the illustrated embodiment shown in FIG. 3, a single third time $T_3$ is followed by a single fourth time $T_4$, but this is not required. In alternative embodiments, other time sequences may be used to process a substrate.

In an alternative embodiment, the exhaust control system 260 can be switched off during a portion of the fourth time $T_4$. For example, the exhaust control system 260 can be switched off during a compression cycle.

During a fifth time $T_5$, the process chamber 208 can be returned to a lower pressure. For example, after the pressure cycling process is completed, then the process chamber 208 can be vented or exhausted to atmospheric pressure.

The high-pressure fluid supply system 240 and/or the pressure control system 250 can comprise means for providing a volume of temperature-controlled fluid during a venting process, and the volume can be larger than the volume of the recirculation loop 215. Alternatively, the volume can be less than or approximately equal to the volume of the recirculation loop 215. In addition, the temperature differential within the volume of temperature-controlled fluid during the venting process can be controlled to be less than approximately 20 degrees Celsius. Alternatively, the temperature variation of the temperature-controlled fluid can be controlled to be less than approximately 15 degrees Celsius during a venting process.

In other embodiments, the high-pressure fluid supply system 240 and/or the pressure control system 250 can comprise means for providing one or more volumes of temperature controlled fluid during a venting process; each volume can be larger than the volume of the process chamber 208 or the volume of the recirculation loop 215; the temperature variation associated with each volume can be controlled to be less than 20 degrees Celsius; and the temperature variation can be allowed to increase as the pressure approaches a final processing pressure.

Furthermore, during the fifth time $T_5$, one or more volumes of temperature controlled supercritical carbon dioxide can be fed into the recirculation loop 215, and the remaining supercritical cleaning solution along with process residue suspended or dissolved therein can be displaced from the process chamber 208 and the other elements in the recirculation loop 215 through the exhaust control system 260. In an alternative embodiment, supercritical carbon dioxide can be fed into the process chamber 208 and/or the recirculation system 220, and the remaining supercritical cleaning solution along with process residue suspended or dissolved therein can also be displaced from the process chamber 208 and the other elements in the recirculation loop 215 through the exhaust control system 260.

Providing temperature-controlled fluid during the venting process prevents process residue suspended or dissolved within the fluid being displaced from the process chamber 208 and the other elements in the recirculation loop 215 from dropping out and/or adhering to the process chamber 208 and the other elements in the recirculation loop 215.

In the illustrated embodiment shown in FIG. 3, a single fourth time $T_4$ is followed by a single fifth time $T_5$, but this is not required. In alternative embodiments, other time sequences may be used to process a substrate.

In one embodiment, during a portion of the fifth time $T_5$, a recirculation pump (not shown) can be switched off. In addition, the temperature of the fluid supplied by the high-pressure fluid supply system 240 can vary over a wider temperature range than the range used during the second time $T_2$. For example, the temperature can range below the temperature required for supercritical operation.

For substrate processing, the chamber pressure can be made substantially equal to the pressure inside of a transfer chamber (not shown) coupled to the process chamber 208. In one embodiment, the substrate can be moved from the process chamber 208 into the transfer chamber, and moved to a second process apparatus or module to continue processing.

In the illustrated embodiment shown in FIG. 3, at the end of the fifth time $T_5$ the pressure returns to an initial pressure $P_0$, but this is not required for the invention. In alternative embodiments, the pressure does not have to return to $P_0$, and the process sequence can continue with additional time steps such as those shown in time steps $T_1$, $T_2$, $T_3$, $T_4$, or $T_5$.

The graph 300 is provided for exemplary purposes only. For example, a low-k layer can be treated using 1 to 10 passivation steps each taking less than approximately 3 minutes, as described above. It will be understood by those skilled in the art that a supercritical processing step can have any number of different time/pressures or temperature profiles without departing from the scope of the invention. Further, any number of cleaning, rinsing, and/or curing process sequences with each step having any number of compression and decompression cycles are contemplated. In addition, as stated previously, concentrations of various chemicals and species within a supercritical processing solution can be readily tailored for the application at hand and altered at any time within a supercritical processing step.

Figure 4:
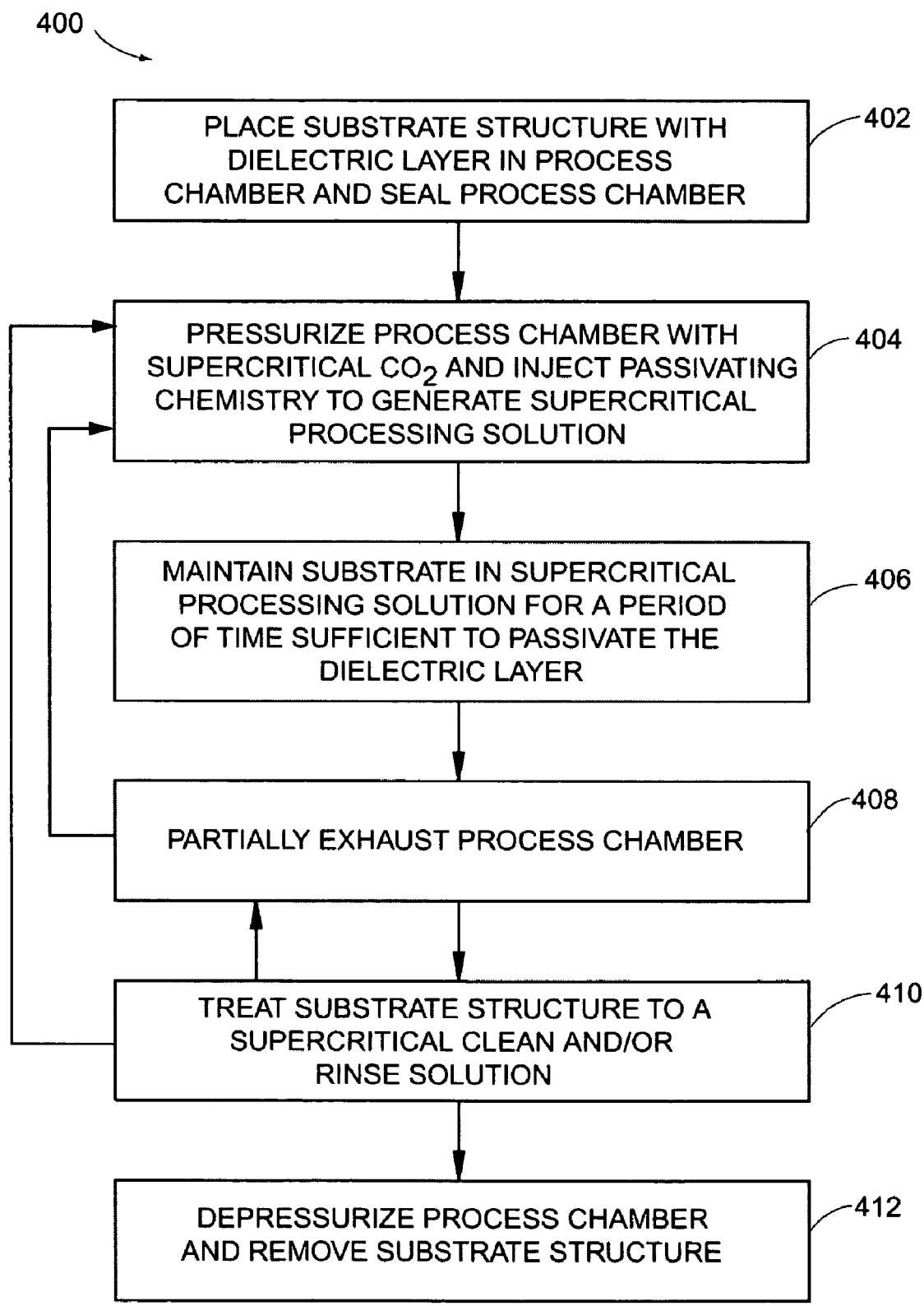
FIG. 4 shows a simplified flow diagram outlining steps for treating a silicon oxide-based low-k layer in accordance with the embodiments of the invention.

FIG. 4 shows a simplified flow diagram outlining steps for treating a silicon oxide-based low-k layer in accordance with the embodiments of the invention. In the illustrated embodiment, a method 400 is shown for treating a substrate structure comprising a patterned low-k layer and post-etch residue thereon using a supercritical cleaning and passivating solution.

In the step 402, the substrate structure comprising a dielectric layer and the post-etch residue is placed within a process chamber, which is then sealed.

In the step 404, the process chamber is pressurized with supercritical $CO_2$ and passivating chemistry is added to the supercritical $CO_2$ to generate a supercritical cleaning and passivating solution. In one embodiment, the cleaning and passivating chemistry comprises at least one organosilicon compound.

In the step 406, the substrate structure is maintained in the supercritical processing solution for a period of time sufficient to remove at least a portion of the residue from the substrate structure and passivate surfaces exposed after the residue is removed. In addition, the supercritical cleaning and passivating solution is circulated through the process chamber and/or otherwise flowed to move the supercritical cleaning and passivating solution over surfaces of the substrate structure.

Still referring to FIG. 4, after at least a portion of the residue is removed from the substrate structure, the process chamber is partially exhausted in the step 408. The cleaning process comprising steps 404 and 406 can be repeated any number of times, as indicated by the arrow connecting the steps 408 to 404, required to remove the residue from the substrate structure and passivate the surfaces exposed. The processing comprising the steps 404 and 406, in accordance with the embodiments of the invention, use fresh supercritical carbon dioxide, fresh chemistry, or both. Alternatively, the concentration of the cleaning chemistry is modified by diluting the process chamber with supercritical carbon dioxide, by adding additional charges of cleaning chemistry or a combination thereof.

Still referring to FIG. 4, after the processing steps 404, 406 and 408 are complete, in the step 410 the substrate structure is preferably treated to a supercritical clean and/or rinse solution. The supercritical clean and/or rinse solution preferably comprises supercritical $CO_2$ and one or more organic solvents, but can be pure supercritical $CO_2$.

After the substrate structure is cleaned in the steps 404, 406 and 408 and rinsed in the step 410, in the step 412, the process chamber is depressurized, and the substrate structure is removed from the process chamber. Alternatively, the substrate structure can be cycled through one or more additional cleaning/rinse processes comprising the steps 404, 406, 408 and 410 as indicated by the arrow connecting steps 410 and 404. Alternatively, or in addition to cycling the substrate structure through one or more additional cleaning/rinse cycles, the substrate structure is treated to several rinse cycles prior to removing the substrate structure from the process chamber in the step 412, as indicated by the arrow connecting the steps 410 and 408.

As described previously, the substrate structure can be dried and/or pretreated prior to passivating the low-k layer thereon by using a supercritical solution comprising supercritical carbon dioxide and one or more solvents such as methanol, ethanol, n-hexane, and/or combinations thereof. In addition, it will be clear of one skilled in the art that a substrate comprising a post-etch residue and/or a patterned low-k dialectic layer can be treated to any number of cleaning and passivating steps and/or sequences.

It will be understood by one skilled in the art, that while the method of passivating low-k material has been primarily described herein with reference to a post-etch treatment and/or a post-etch cleaning treatment, the method of the present invention can be used to directly passivate low-k materials. Further, it will be appreciated that when treating a low-k material, in accordance with the method of the present invention, a supercritical rinse step is not always necessary and simply drying the low-k material prior to treating the low-k material with a supercritical passivating solution can be appropriate for some applications.

The present invention has the advantages of being capable of passivating a low-k surface and being compatible with other processing steps, such as removing post-etch residues (including, but not limited to, spin-on polymeric anti-reflective coating layers and photopolymers) for patterned low-k layers in a supercritical processing environment. The present invention also has been observed to restore or partially restore k-values of materials lost after patterning steps and has been shown to produce low-k layers that are stable over time.

While the invention has been described in terms of specific embodiments incorporating details to facilitate the understanding of the principles of construction and operation of the invention, such reference herein to specific embodiments and details thereof is not intended to limit the scope of the claims appended hereto. It will be apparent to those skilled in the art that modifications may be made in the embodiments chosen for illustration without departing from the spirit and scope of the invention. Specifically, while supercritical $CO_2$ is the preferred medium for cleaning and/or passivating, other supercritical media alone or in combination with supercritical $CO_2$ can also be used.

What is claimed is:

1. A method of treating a patterned surface of a dielectric material comprising:
    removing post-etch residue from a plurality of patterned features in a dielectric material with a passivating solution comprising a fluid and an amount of a silylating agent comprising organic groups; and
    removing the passivating solution, wherein at least one of the plurality of patterned features is at least partially passivated with the organic groups, thereby restoring the k-value of the dielectric material to a pre-patterned value and resulting in the dielectric material being at least partially hydrophobic.

2. The method of claim 1, wherein the dielectric material comprises a low-k material.

3. The method of claim 1, wherein the dielectric material comprises an ultra-low-k material.

4. The method of claim 1, wherein the fluid comprises a supercritical fluid.

5. The method of claim 4, wherein the supercritical fluid comprises supercritical CO2.

6. The method of claim 1, wherein the organic groups comprise alkyl groups.

7. The method of claim 1, wherein the organic groups comprise less than six carbon atoms.

8. The method of claim 1, wherein the organic groups comprise an organosilicon compound.

9. The method of claim 8, wherein the organosilicon compound is selected from the group consisting of hexamethyldisilazane (HMDS), chlorotrimethylsilane (TMCS), trichloromethylsilane (TCMS), and combinations thereof.

10. The method of claim 1, wherein the passivating solution further comprises a carrier solvent.

11. The method of claim 10, wherein the carrier solvent is selected from the group consisting of N, N-dimethylacetamide (DMAc), gamma-butyrolactone (BLO), dimethyl sulfoxide (DMSO), ethylene carbonate (EC), N-methylpyrrolidone (NMP), dimethylpiperidone, propylene carbonate, alkane and combinations thereof.

12. The method of claim 1, wherein the dielectric material is maintained at temperatures in a range of approximately 40 degrees Celsius to approximately 250 degrees Celsius.

13. The method of claim 1, wherein the passivating solution is maintained at temperatures in a range of approximately 40 degrees Celsius to approximately 250 degrees Celsius.

14. The method of claim 1, wherein the removing post-etch residue from a plurality of patterned features in a dielectric material with a passivating solution further comprises circulating the passivating solution over the low-k surface.

15. The method of claim 1, wherein the passivating solution is maintained at pressures in a range of approximately 1,000 psi to approximately 9,000 psi.

16. The method of claim 1, further comprising drying at least one surface of the dielectric material prior to removing post-etch residue from a plurality of patterned features in a dielectric material with a passivating solution.

17. The method of claim 16, wherein the drying at least one surface comprises treating the at least one surface to a supercritical drying solution comprising supercritical carbon dioxide.

18. The method of claim 1, wherein the dielectric material comprises silicon-oxide.

19. The method of claim 1, wherein the dielectric material comprises a material selected from the group consisting of a carbon doped oxide (COD), a spin-on-glass (SOG), a fluoridated silicon glass (FSG), and combinations thereof.

20. A method of treating a patterned surface of a dielectric material, comprising:
    removing post ash residue from at least one patterned surface of a dielectric material with a supercritical cleaning solution; and
    treating the dielectric material with a passivating solution comprising a passivating agent in the supercritical cleaning solution to form a passivated dielectric surface, thereby restoring the k-value of the dielectric material to a pre-patterned value and resulting in the dielectric material being at least partially hydrophobic.

21. The method of claim 20, wherein the post ash residue comprises a polymer.

22. The method of claim 21, wherein the polymer is a photoresist polymer.

23. The method of claim 22, wherein the photoresist polymer comprises an anti-reflective dye.

24. The method of claim 20, wherein the dielectric material comprises a low-k material.

25. The method of claim 20, wherein the dielectric material comprises an ultra-low-k material.

26. The method of claim 20, wherein the post ash residue comprises an anti-reflective coating.

27. The method of claim 26, wherein the anti-reflective coating comprises an organic spin-on anti-reflective material.

28. The method of claim 20, wherein the passivating agent comprises an organosilicon compound.

29. The method of claim 28, wherein the organosilicon compound is selected from the group consisting of hexamethyldisilazane (HMDS), chlorotrimethylsilane (TMCS), trichloromethylsilane (TCMS) and combinations thereof.

30. A method of forming an at least partially hydrophobic patterned dielectric layer, the method comprising;
    depositing a continuous layer of dielectric material with an initial k-value;
    forming a photoresist mask over the continuous layer of dielectric material;
    patterning the continuous layer of dielectric material through the photoresist mask;
    removing the photoresist mask, thereby forming a post-ash residue and causing the dielectric material to have an intermediate k-value greater than the initial k-value; and
    removing the post-ash residue using a supercritical solution comprising supercritical fluid and a silicon-based passivating agent, thereby causing the dielectric material to have a post-passivating k-value greater than the intermediate k-value, and thereby causing the layer of dielectric material to be at least partially hydrophobic.

31. The method of claim 30, wherein the supercritical fluid comprises supercritical carbon dioxide.

32. The method of claim 30, wherein the silicon-based passivating agent comprises an organosilicon compound.

33. The method of claim 30, wherein the supercritical fluid further comprises a carrier solvent.

34. The method of claim 33, wherein the carrier solvent is selected from the group consisting of N, N-dimethylacetamide (DMAc), gamma-butyrolactone (BLO), dimethyl sulfoxide (DMSO), ethylene carbonate (EC), N-methylpyrrolidone (NMP), dimethylpiperidone, propylene carbonate, alkane and combinations thereof.

35. The method of claim 30, wherein the initial k-value is a low k-value.

36. The method of claim 30, wherein the initial k-value is an ultra-low k-value.

* * * * *

UNITED STATES PATENT AND TRADEMARK OFFICE
CERTIFICATE OF CORRECTION

PATENT NO.        : 7,387,868 B2                                      Page 1 of 1
APPLICATION NO.   : 11/092031
DATED             : June 17, 2008
INVENTOR(S)       : Jacobson et al.

It is certified that error appears in the above-identified patent and that said Letters Patent is hereby corrected as shown below:

<u>ON THE TITLE PAGE, ON PAGE 5 - Item -56-</u>

Insert the following references:

JP    60-192333    9/1985
JP    62-111442    5/1987
JP    63-179530    7/1988

Signed and Sealed this

Nineteenth Day of August, 2008

JON W. DUDAS
*Director of the United States Patent and Trademark Office*